(12) United States Patent
Saito et al.

(10) Patent No.: US 10,714,629 B2
(45) Date of Patent: Jul. 14, 2020

(54) TRANSISTOR, SEMICONDUCTOR MEMORY DEVICE, AND METHOD OF MANUFACTURING TRANSISTOR

(71) Applicant: TOSHIBA MEMORY CORPORATION, Minato-ku, Tokyo (JP)

(72) Inventors: Nobuyoshi Saito, Tokyo (JP); Tomomasa Ueda, Yokohama Kanagawa (JP); Kentaro Miura, Kawasaki Kanagawa (JP); Keiji Ikeda, Kawasaki Kanagawa (JP); Tsutomu Tezuka, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/122,834

(22) Filed: Sep. 5, 2018

(65) Prior Publication Data

US 2019/0237581 A1  Aug. 1, 2019

(30) Foreign Application Priority Data

Jan. 31, 2018  (JP) .................. 2018-015473

(51) Int. Cl.
| H01L 29/786 | (2006.01) |
| H01L 27/108 | (2006.01) |
| H01L 29/66 | (2006.01) |
| H01L 21/02 | (2006.01) |

(52) U.S. Cl.
CPC ...... H01L 29/7869 (2013.01); H01L 21/0228 (2013.01); H01L 27/10805 (2013.01); H01L 29/66742 (2013.01); H01L 29/66969 (2013.01); H01L 29/78642 (2013.01)

(58) Field of Classification Search
CPC .......... H01L 29/7869; H01L 29/78642; H01L 29/66742; H01L 27/10805
See application file for complete search history.

(56) References Cited

U.S. PATENT DOCUMENTS

| 9,449,853 B2 * | 9/2016 | Yamamoto ........ H01L 21/28194 |
| 9,698,272 B1 * | 7/2017 | Ikeda ................ H01L 29/78606 |
| 2010/0032668 A1 | 2/2010 | Yamazaki et al. |
| 2013/0285051 A1 | 10/2013 | Tanaka |
| 2015/0069320 A1 | 3/2015 | Rabkin et al. |

FOREIGN PATENT DOCUMENTS

| JP | 2010-062547 A | 3/2010 |
| JP | 2013-251533 A | 12/2013 |

* cited by examiner

*Primary Examiner* — Hsien Ming Lee
(74) *Attorney, Agent, or Firm* — Foley & Lardner LLP

(57) ABSTRACT

According to one embodiment, a transistor includes first to third conductors, first and second oxide semiconductors, and a gate insulating film. The first and second conductors are stacked via an insulator above a substrate. The first oxide semiconductor is formed on the first conductor. The second oxide semiconductor is formed on the first oxide semiconductor. The second oxide semiconductor have a pillar shape through the second conductor along a first direction crossing a surface of the substrate. The second oxide semiconductor is different from the first oxide semiconductor. The gate insulating film is formed between the second conductor and the second oxide semiconductor. The third conductor is formed on the second oxide semiconductor.

13 Claims, 22 Drawing Sheets

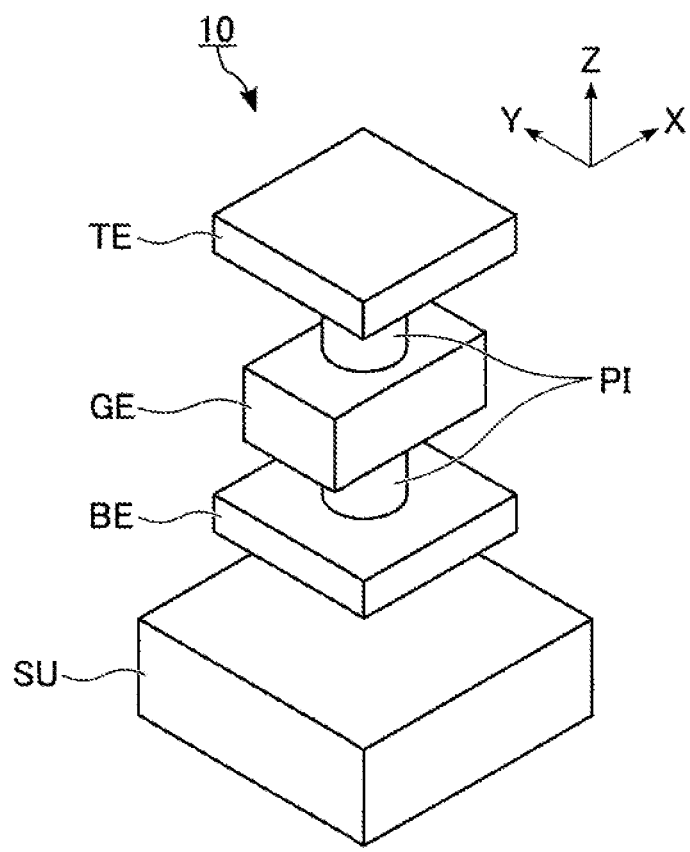
F I G. 1

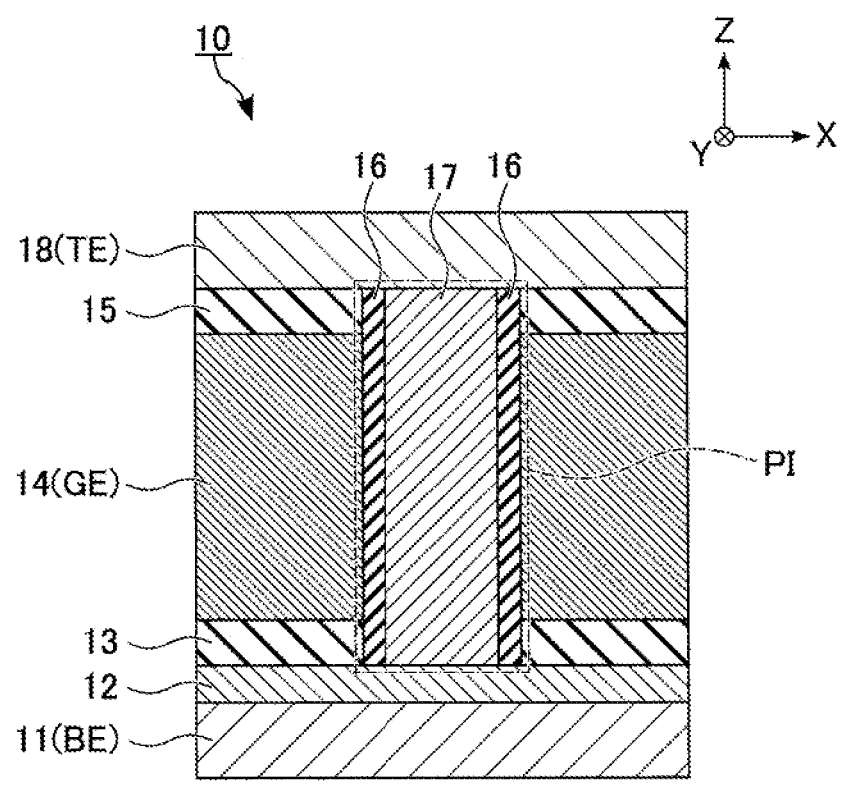
F I G. 2

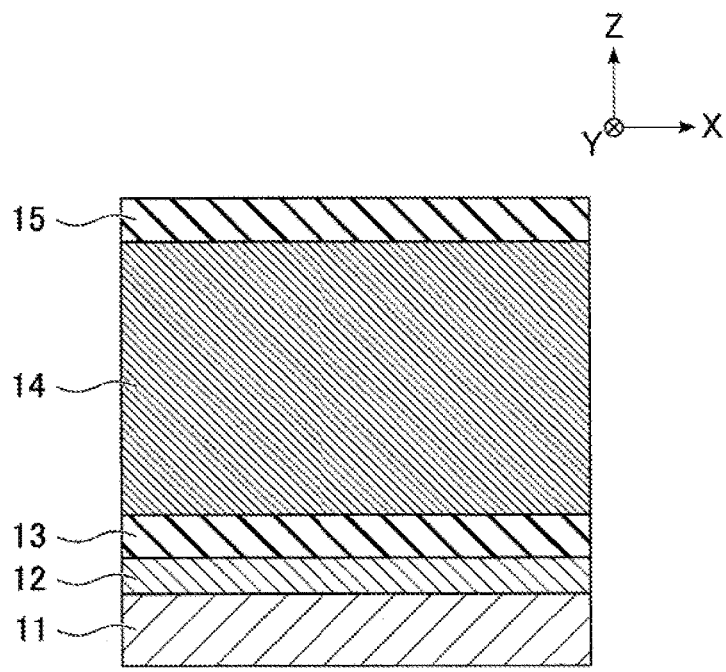
F I G. 6
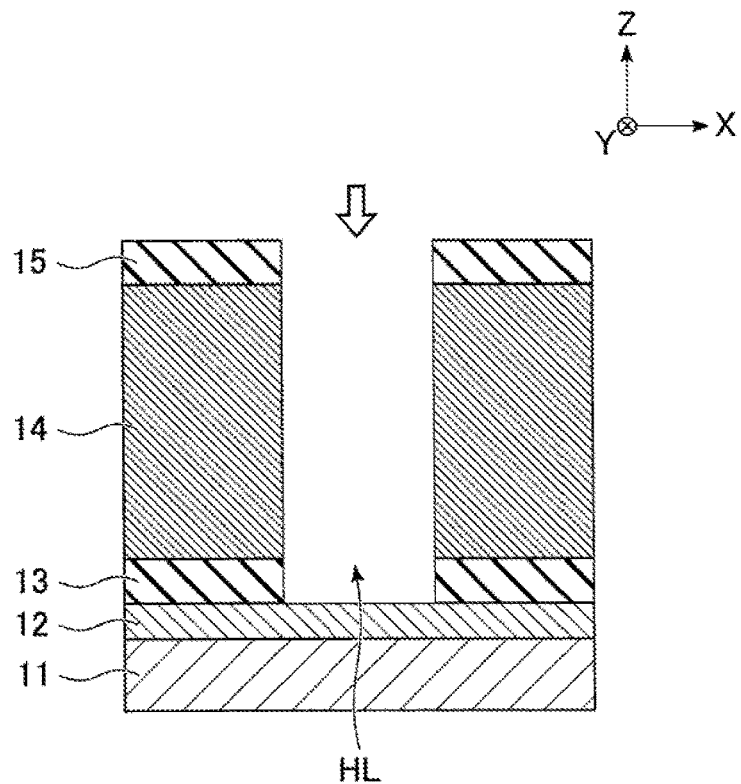
F I G. 7

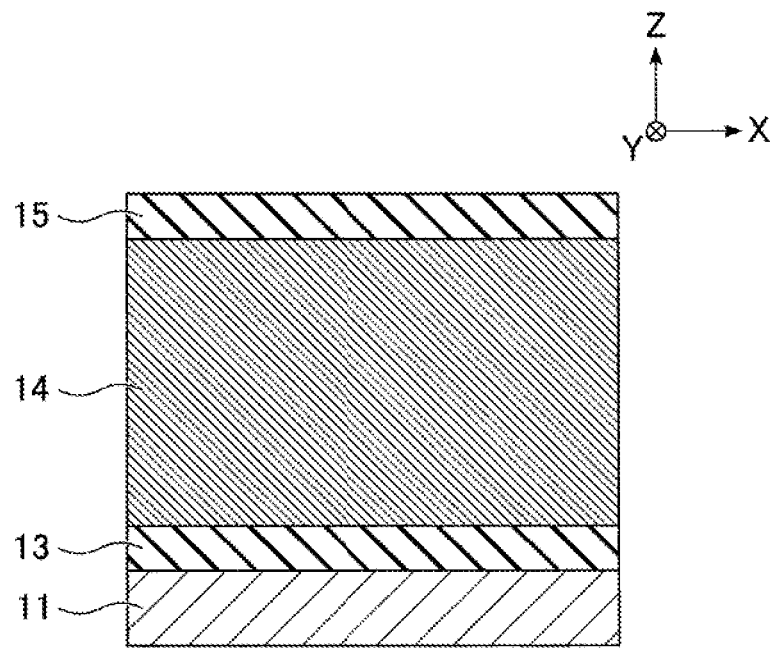
F I G. 16
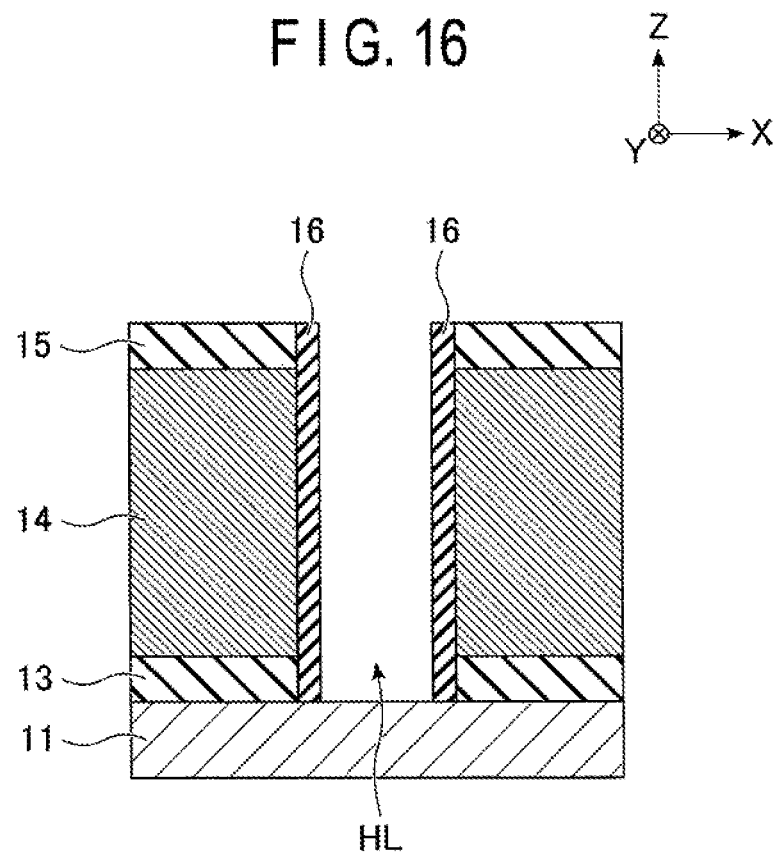
F I G. 17

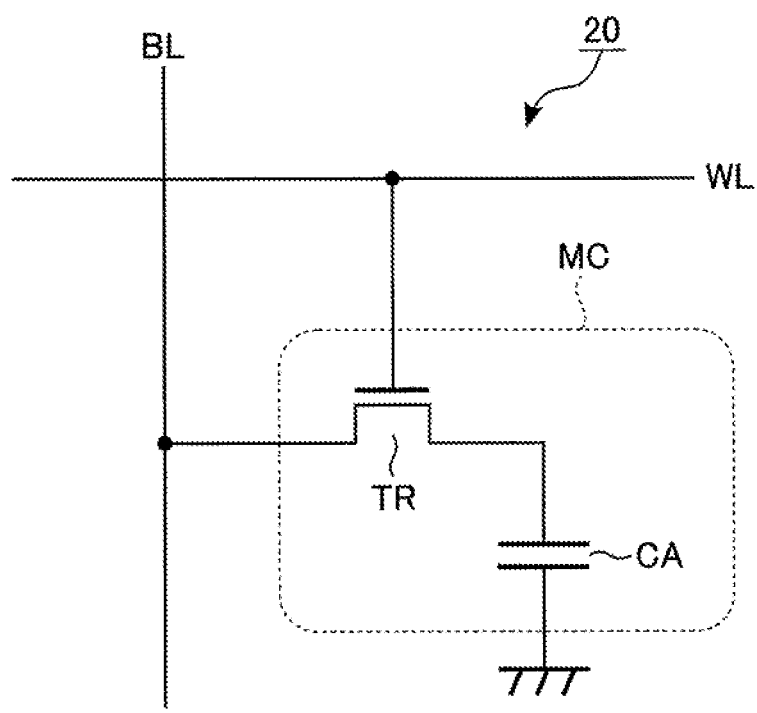
F I G. 22

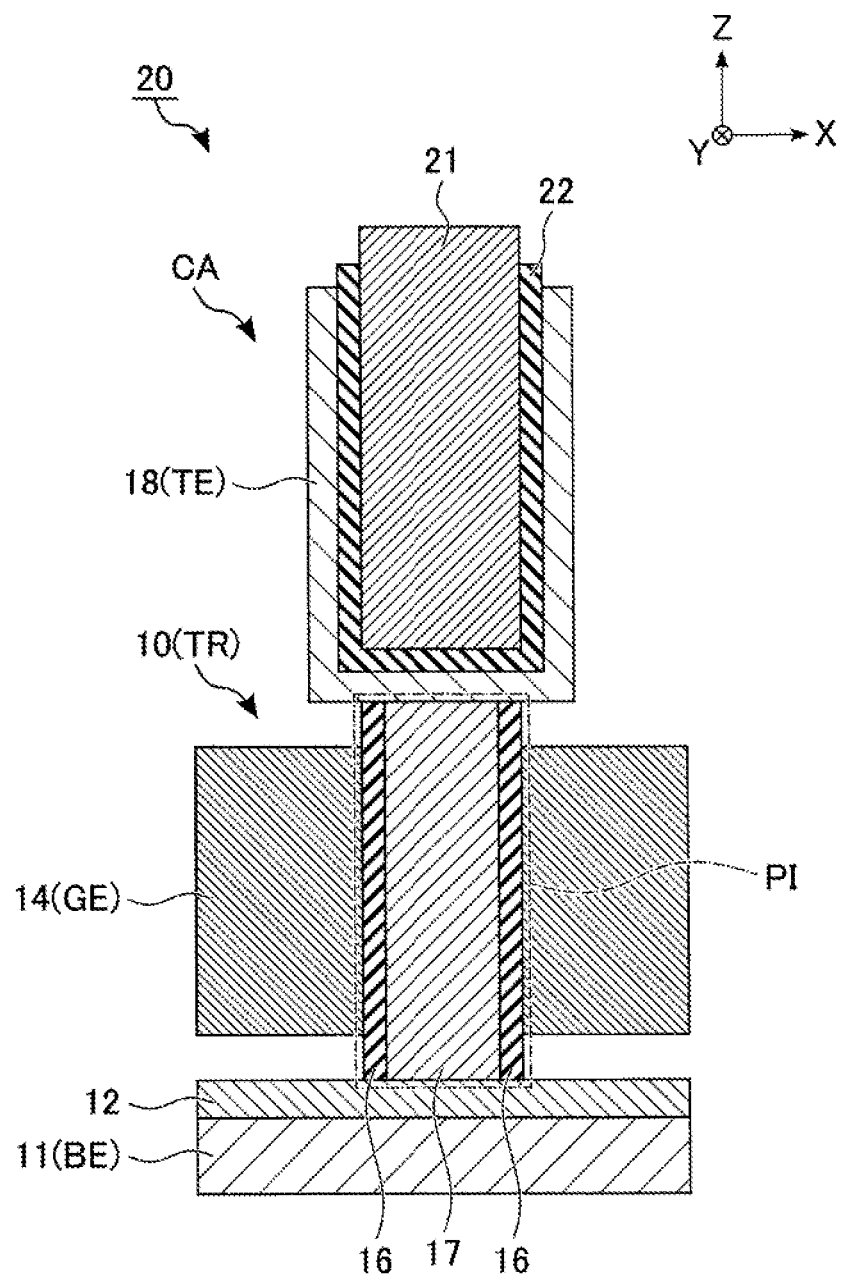
F I G. 24

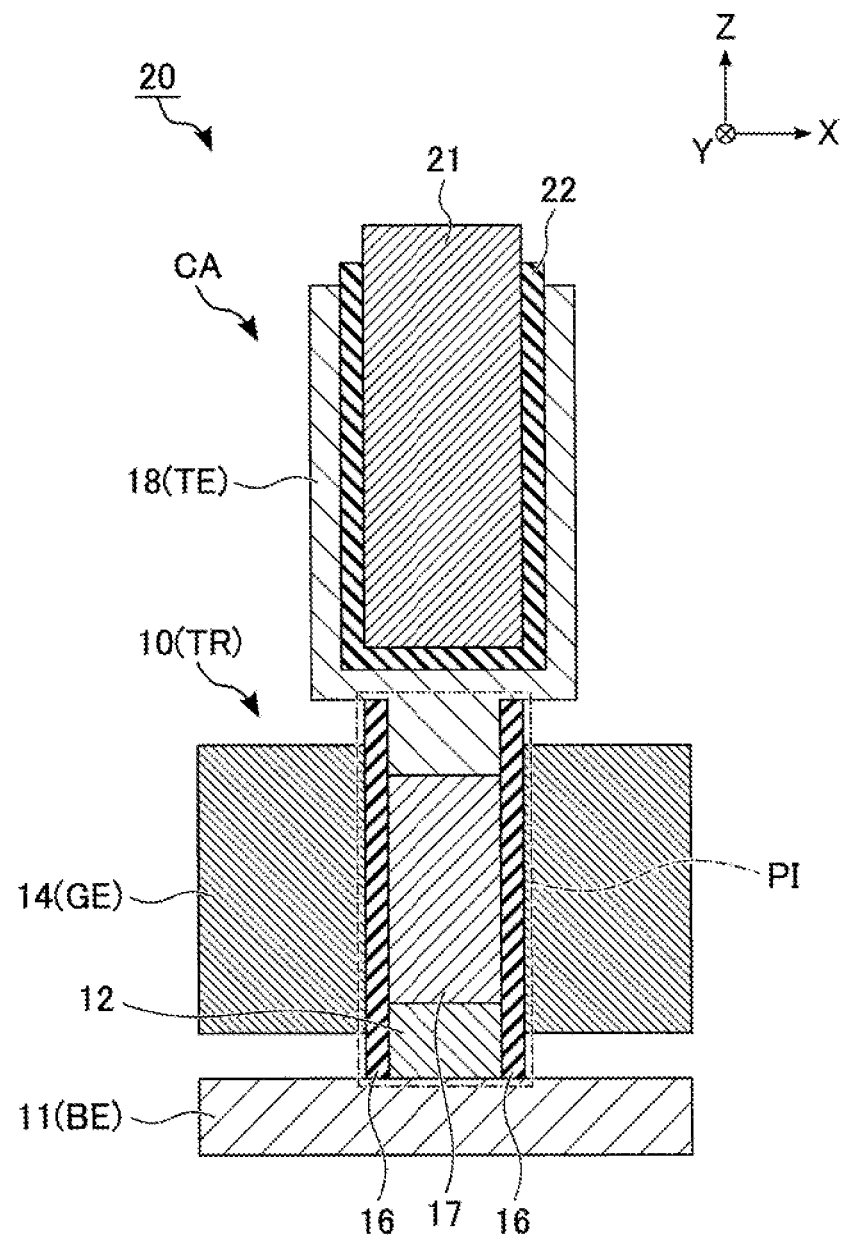
F I G. 25

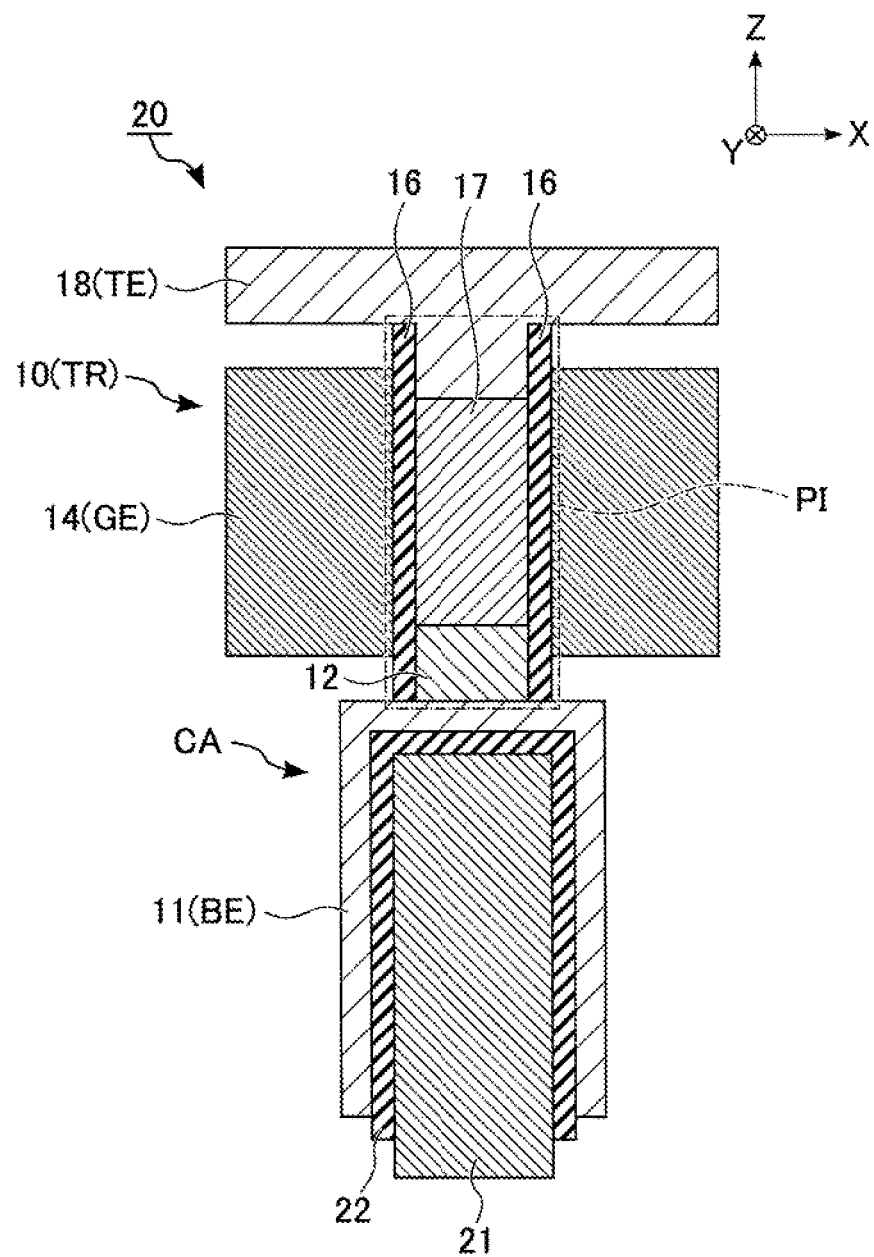
F I G. 28

TRANSISTOR, SEMICONDUCTOR MEMORY DEVICE, AND METHOD OF MANUFACTURING TRANSISTOR

CROSS-REFERENCE TO RELATED APPLICATIONS

This application is based upon and claims the benefit of priority from Japanese Patent Application No. 2018-015473, filed Jan. 31, 2018, the entire contents of which are incorporated herein by reference.

FIELD

Embodiments relate to a transistor, a semiconductor memory device, and a method of manufacturing the transistor.

BACKGROUND

For a transistor such as a field effect transistor (FET), it is preferable that there is no, or only a minimal leak current when the transistor is off. As a transistor having excellent leak characteristics at the time when the transistor is off, a transistor using an oxide semiconductor as the channel has been receiving attention in recent years.

In the transistor using an oxide semiconductor as the channel, however, a high-resistance metal oxide layer may be formed between the oxide semiconductor and a metal electrode, and the contact resistance of the metal electrode may be thereby increased.

BRIEF DESCRIPTION OF THE DRAWINGS

FIG. 1 is a perspective view showing a structure example of the transistor according to a first embodiment.

FIG. 2 is a cross-sectional view showing an example of the cross-section structure of the transistor according to the first embodiment.

FIGS. 4, 5, 6, 7, 8, 9, and 10 are cross-sectional views showing an example of the process for manufacturing the transistor according to the first embodiment.

FIGS. 16, 17, 18, 19, and 20 are cross-sectional views of the transistor showing an example of the process for manufacturing the transistor according to the second embodiment.

FIG. 22 is a circuit diagram showing an example of the circuit configuration of the semiconductor memory device according to a third embodiment.

FIGS. 24 and 25 are cross-sectional views showing examples of the cross-section structure of the transistor according to the third embodiment.

FIGS. 27 and 28 are cross-sectional views showing examples of the cross-section structure of the semiconductor memory device according to the fourth embodiment.

DETAILED DESCRIPTION

Figure 3:
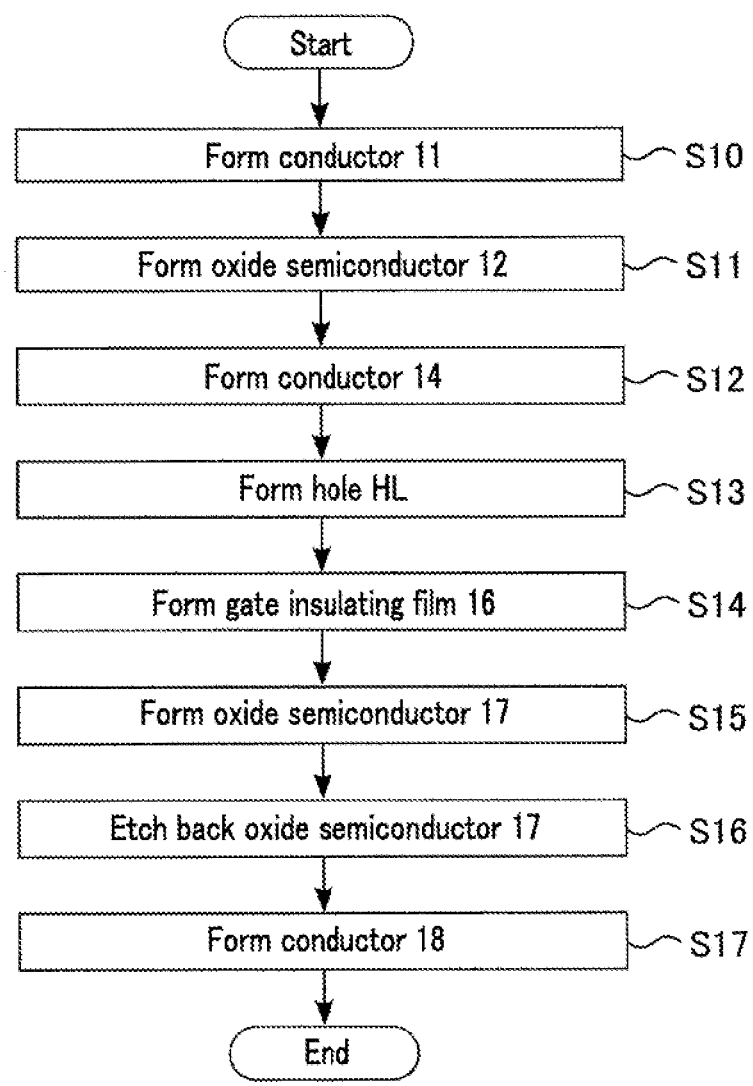
FIG. 3 is a flowchart showing an example of the method of manufacturing the transistor according to the first embodiment.

A transistor according to an embodiment includes first to third conductors, first and second oxide semiconductors, and a gate insulating film. The first and second conductors are stacked via an insulator above a substrate. The first oxide semiconductor is formed on the first conductor. The second oxide semiconductor is formed on the first oxide semiconductor. The second oxide semiconductor have a pillar shape through the second conductor along a first direction crossing a surface of the substrate. The second oxide semiconductor is different from the first oxide semiconductor. The gate insulating film is formed between the second conductor and the second oxide semiconductor. The third conductor is formed on the second oxide semiconductor.

Hereinafter, embodiments will be described with reference to the drawings. The drawings are schematic or conceptual, and the dimensions and ratios, etc. in the drawings are not always the same as the actual ones. Each embodiment exemplifies a device and method for embodying the technical idea of the present invention. In the following descriptions, constituent elements having substantially the same function and configuration will be assigned with the same reference numeral.

[1] First Embodiment

Hereinafter, a transistor 10 according to a first embodiment will be described.

[1-1] Structure of Transistor 10

FIG. 1 is a perspective view showing a structure example of the transistor 10 according to the first embodiment. In the drawings referred to in this specification, the plane defined by the X-axis and the Y-axis corresponds to a plane parallel to the surface of the substrate SU, and the Z-axis corresponds to a direction crossing the surface of the substrate SU. In the drawings referred to below, interlayer insulating films and the substrate SU are omitted as appropriate.

As shown in FIG. 1, the transistor 10 includes a bottom electrode BE, a top electrode TE, a gate electrode GE, and a pillar portion PI. The bottom electrode BE is provided, for example, above the substrate SU. The top electrode TE is provided, for example, above the bottom electrode BE. The gate electrode GE is provided between the bottom electrode BE and the top electrode TE. The pillar portion PI takes, for example, a pillar shape extending in the Z-direction, and passes through the gate electrode GE. The bottom of the pillar portion PI is electrically coupled to the bottom electrode BE, and the top thereof is electrically coupled to the top electrode TE.

The bottom electrode BE and top electrode TE each function as the source electrode or drain electrode of the transistor 10. The gate electrode GE functions as the gate electrode of the transistor 10. The pillar portion PI functions as the current path (channel) of the transistor 10. The transistor 10 is called, for example, a vertical transistor because a current flows between the bottom electrode BE and the top electrode TE via the pillar portion PI extending in the Z-direction.

Next, a more detailed structure of the transistor 10 will be described with reference to FIG. 2. FIG. 2 shows an example of the cross-section structure of the transistor according to the first embodiment. As shown in FIG. 2, the transistor 10 includes conductors 11, 14, and 18, an oxide semiconductor 12, insulators 13 and 15, and a pillar portion PI.

The oxide semiconductor 12 is provided on conductor 11. Insulator 13 is provided on the oxide semiconductor 12. Conductor 14 is provided on insulator 13. Insulator 15 is provided on conductor 14. Conductor 18 is provided on insulator 15. The pillar portion PI is provided between the oxide semiconductor 12 and conductor 18. The pillar portion PT includes a gate insulating film 16 and an oxide semiconductor 17.

The gate insulating film 16 is cylindrically provided in the pillar portion PI in contact with conductor 14. Oxide semiconductor 17 is provided on the inner wall of the gate insulating film 16. In other words, oxide semiconductor 17 is, for example, filled in the cylindrical gate insulating film 16. The bottom of oxide semiconductor 17 is in contact with oxide semiconductor 12. The top of oxide semiconductor 17 is in contact with conductor 18.

In other words, in the cross section parallel to the X-Y plane, oxide semiconductor 17 is provided in the center part of the pillar portion PI, and the gate insulating film 16 is provided around oxide semiconductor 17. Namely, oxide semiconductor 17 is insulated from conductor 14, which functions as the gate electrode, by the gate insulating film 16.

In the above structure, conductor 11 functions as the bottom electrode BE, conductor 14 functions as the gate electrode GE, and conductor 18 functions as the top electrode TE. The channel of the transistor 10 is formed in oxide semiconductor 17.

Conductors 11, 14, and 18 each contain one of copper (Cu) and tungsten (W), for example. Oxide semiconductors 12 and 17 each contain indium oxide, gallium oxide, and zinc oxide, for example. Such an oxide semiconductor containing indium oxide, gallium oxide, and zinc oxide is called In—Ga—Zn oxide (IGZO), for example. As oxide semiconductor 17, oxide containing at least one of indium, zinc, and tin (such as InO, InZnO, InSnO, SnO, ZnO, or ZnSnO) may be used.

The carrier density of oxide semiconductor 12 is higher than that of oxide semiconductor 17. Specifically, in the first embodiment, the carrier density of oxide semiconductor 12 is designed to be higher than $10^{18}$ ($cm^{-3}$), and the carrier density of oxide semiconductor 17 is designed to be lower than ($10^{17}$ $cm^{-3}$), for example. In this specification, the "carrier density" refers to the carrier density in the state where no bias is applied to the target structural element.

[1-2] Method for Manufacturing Transistor 10

FIG. 3 is a flowchart showing an example of the process for manufacturing the transistor 10 according to the first embodiment, and FIGS. 4-10 each show an example of the cross-section structure in respective manufacturing processes of the transistor 10. Hereinafter, an example of the method of manufacturing the transistor 10 according to the first embodiment will be described from formation of the bottom electrode BE to formation of the top electrode TE, with reference to FIG. 3, and one of FIGS. 4-10.

Figure 4:
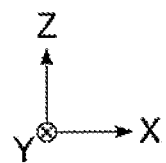
Figure 4:
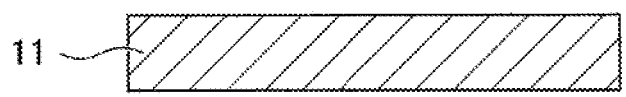

First, in step S10, conductor 11 corresponding to the bottom electrode BE is formed above a substrate (not shown), as shown in FIG. 4. For the formation of conductor 11, for example, sputtering is used.

Figure 5:
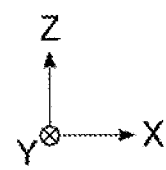
Figure 5:
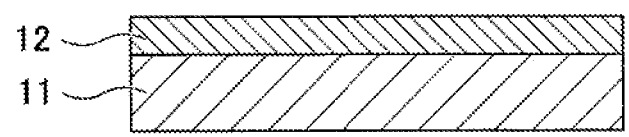

Next, in step S11, oxide semiconductor 12 is formed on conductor 11, as shown in FIG. 5. Specifically, oxide semiconductor 12 is formed by sputtering in a chamber with an atmosphere of inactive gas, such as argon (Ar), only. In other words, the sputtering process for forming a film of oxide semiconductor 12 is performed in a state where the chamber is filled with an atmosphere of argon (Ar), for example. The state in which the sputtering process is performed is not limited to this; however, it is preferable that the film of oxide semiconductor 12 be formed in a state where the oxygen density in the chamber of the sputtering device is low, for example. The target of the sputtering is, for example, IGZO (InGaZnO).

Next, in step S12, conductor 14 corresponding to the gate electrode GE is formed, as shown in FIG. 6. Specifically, insulator 13, conductor 14, and insulator 15 are sequentially formed on oxide semiconductor 12. For the formation of conductor 14, for example, sputtering is used.

Next, in step S13, a hole HL corresponding to the pillar portion PI is formed, as shown in FIG. 7. Specifically, the hole HL is formed by, for example, photolithography and anisotropic etching from the upper surface of insulator 15 to reach the upper surface of oxide semiconductor 12. As the anisotropic etching, for example, reactive ion etching (RIE) is used.

Figure 8:
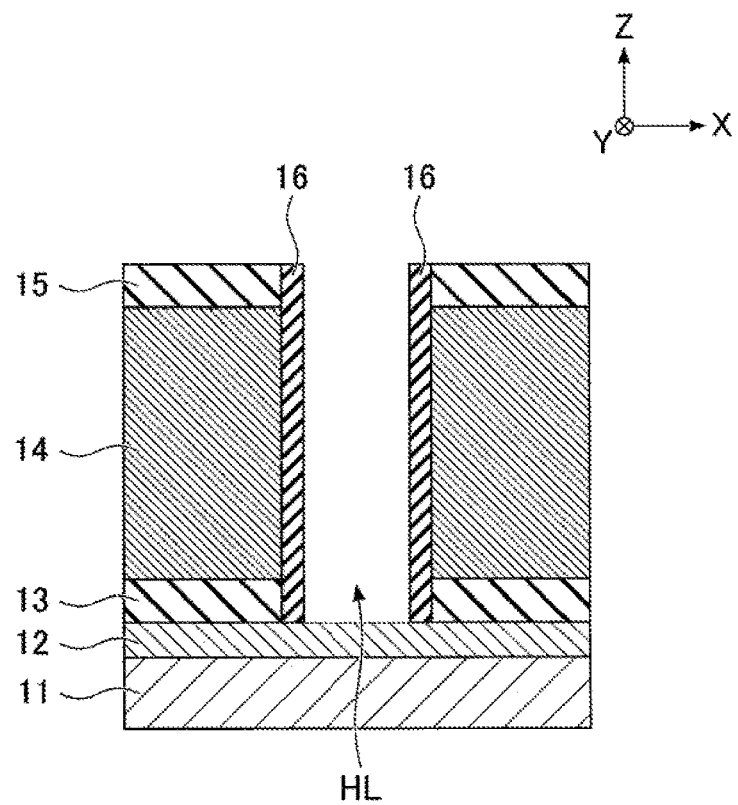

Next, in step S14, the gate insulating film 16 is formed on the inner wall of the hole HL, as shown in FIG. 8. Specifically, the gate insulating film 16 is first formed on each of the upper surfaces of insulator 15, the inner wall of the hole HL, and the bottom of the hole HL by, for example, chemical vapor deposition (CVD). Then, the gate insulating film 16 formed on each of insulator 15, and the bottom of the hole HL is removed by anisotropic etching, such as RIE. In the anisotropic etching, at least the gate insulating film 16 formed on the bottom of the hole HL may be removed.

Figure 9:
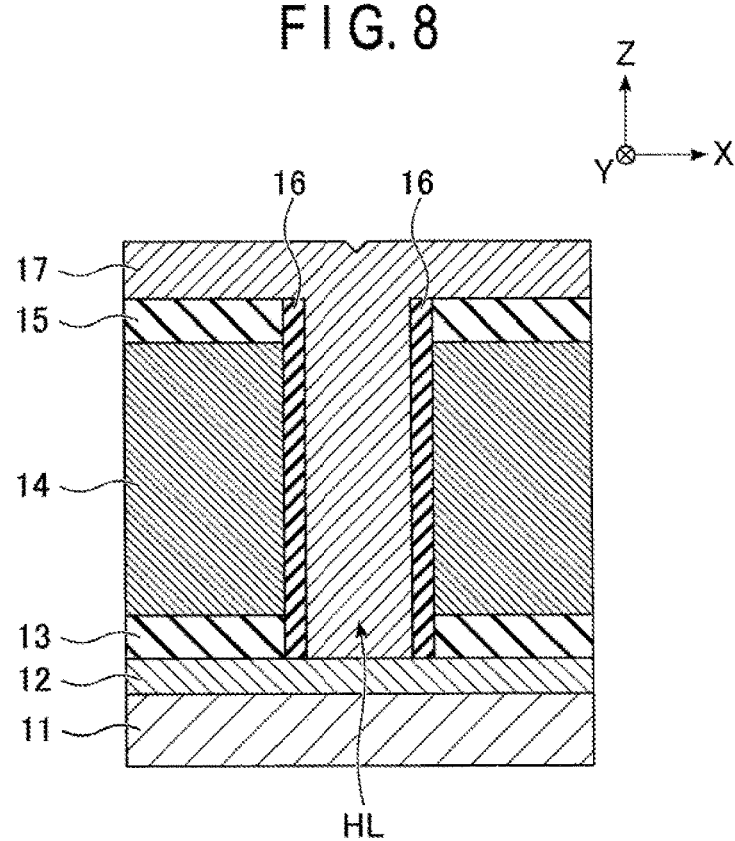

Next, in step S15, oxide semiconductor 17 is formed, as shown in FIG. 9. Specifically, oxide semiconductor 17 is filled in the entire hole HL by, for example, atomic layer deposition (ALD) to be brought into contact with oxide semiconductor 12 at the bottom of the hole HL. In this process, as oxide semiconductor 17 is formed in the hole HL, oxide semiconductor 17 is also formed on insulator 15.

Figure 10:
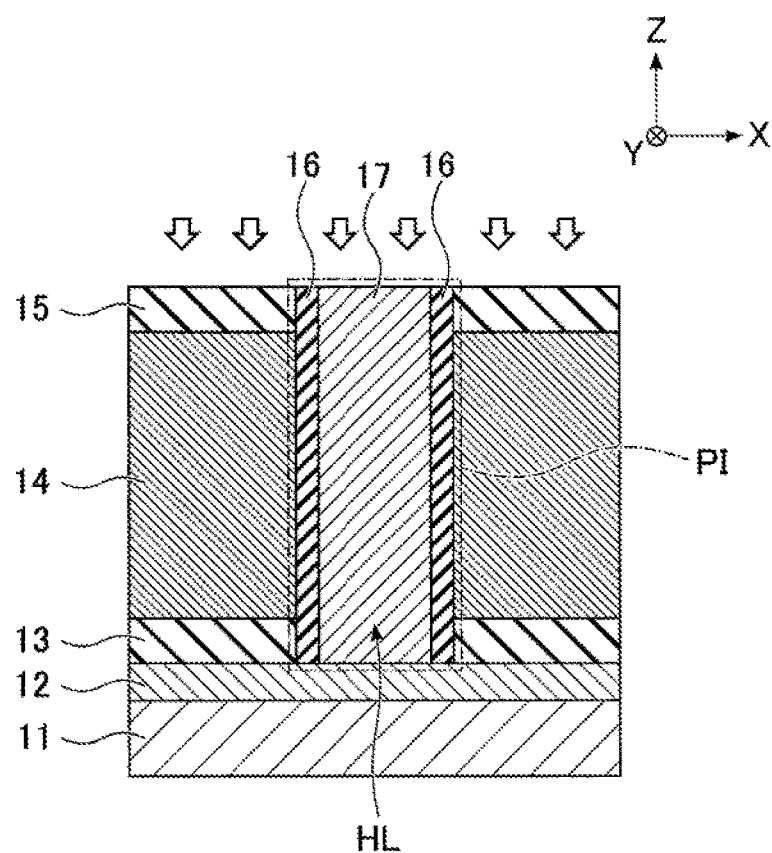

Next, in step S16, oxide semiconductor 17 is etched back, as shown in FIG. 10. In the etching back process, oxide semiconductor 17 formed, for example, above the layer in which insulator 15 is formed, is removed. The upper surfaces of insulator 15, the gate insulating film 16, and oxide semiconductor 17 may be planarized by chemical mechanical polishing (CMP) after the etching back process.

Then, in step S17, conductor 18 corresponding to the top electrode TE is formed by, for example, sputtering. Accordingly, the structure of the transistor 10 according to the first embodiment described with reference to FIG. 2 is formed.

In the process for manufacturing the transistor 10 according to the first embodiment, when the films of oxide semiconductors 12 and 17 are each formed by sputtering, the oxygen density in the chamber of the sputtering device for forming the film of oxide semiconductor 12 is set lower than that for forming the film of oxide semiconductor 17.

[1-3] Advantage of First Embodiment

The transistor 10 according to the first embodiment as described above can inhibit an increase in the contact resistance in the transistor. Hereinafter, a detailed advantage of the transistor 10 according to the first embodiment will be described.

The transistor using an oxide semiconductor as the channel has a small leak current when the transistor is off, i.e., has excellent off leak characteristics. Such a transistor may be designed as a vertical transistor having a structure in which, for example, an oxide semiconductor in which the channel is formed takes a pillar shape, in accordance with the demand of the semiconductor device in which the transistor is used.

In such a case, a difference in the contact resistance can be caused between the electrode coupled to the upper surface of the oxide semiconductor formed into a pillar shape, and the electrode coupled to the lower surface thereof. Hereinafter, the difference in resistivity between the case where a transistor including an oxide semiconductor is formed on a surface parallel to the substrate, and electrodes are coupled to the top of the oxide semiconductor (top-contact structure), and the case where the electrodes are coupled to the bottom of the oxide semiconductor (bottom-contact structure), will be described with reference to FIG. 11.

Figure 11:
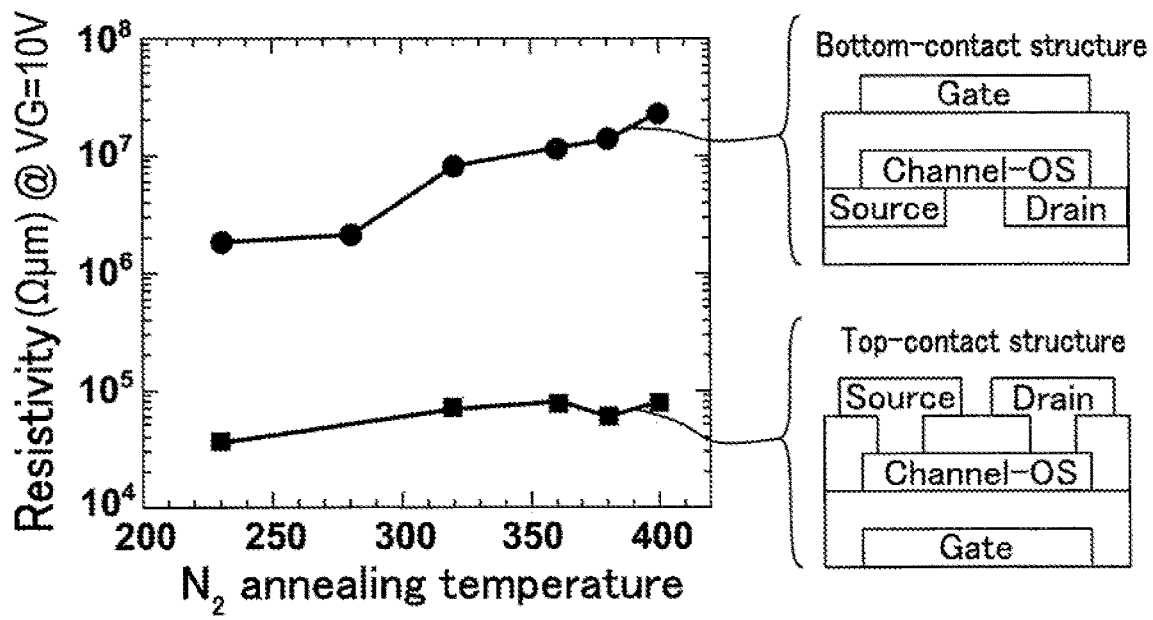
FIG. 11 is a graph showing an example of the result of measurement of the parasitic resistance in each of the transistors having different contact structures.

In the top-contact structure shown in FIG. 11, the gate electrode is provided in a layer lower than the oxide semiconductor (Channel-OS), and the source electrode and the drain electrode are each coupled to the oxide semiconductor from above. In the bottom-contact structure, the gate electrode is provided in a layer higher than the oxide semiconductor, and the source electrode and the drain electrode are each coupled to the oxide semiconductor from below (the substrate side). The other part of the structure is the same in the top-contact structure and the bottom-contact structure.

The horizontal axis of the graph shown in FIG. 11 corresponds to the $N_2$ annealing temperature (° C.), and the vertical axis corresponds to the resistivity ($\Omega \cdot \mu m$) of the parasitic resistance between the source electrode and the drain electrode in the case where the gate voltage is fixed in each structure.

As shown in FIG. 11, the resistivity in the top-contact structure is lower than that in the bottom-contact structure at any $N_2$ annealing temperature. Namely, FIG. 11 shows that the parasitic resistance in the bottom-contact structure is made higher than that in the top-contact structure by the contact resistance between the oxide semiconductor and source electrode and that between the oxide semiconductor and drain electrode.

Accordingly, for example, formation of the high-resistance interface layer between the channel and the primary metal electrode in the channel film formation process can be considered as a reason that the parasitic resistance in the top-contact structure differs from that in the bottom-contact structure.

Therefore, in the transistor 10 according to the first embodiment, oxide semiconductor 12 different from oxide semiconductor 17 is provided between the bottom of oxide semiconductor 17 in which the channel is formed and an electrode coupled to the bottom of oxide semiconductor 17.

The film of oxide semiconductor 12 is formed by sputtering in a chamber with an atmosphere of inactive gas, such as argon (Ar), only. Oxide semiconductor 12 formed by sputtering in a chamber with a reduced oxygen density as described above contains less oxygen than, for example, the oxide semiconductor formed by sputtering in an atmosphere including oxygen and the oxide semiconductor formed by ALD or the like, and has a higher carrier density than those oxide semiconductors.

Hereinafter, the difference in resistivity between the case where an oxide semiconductor with a high carrier density is provided between the oxide semiconductor of the channel and the bottom electrode (embodiment) and the case where it is not provided (comparative example) will be described with reference to FIG. 12.

Figure 12:
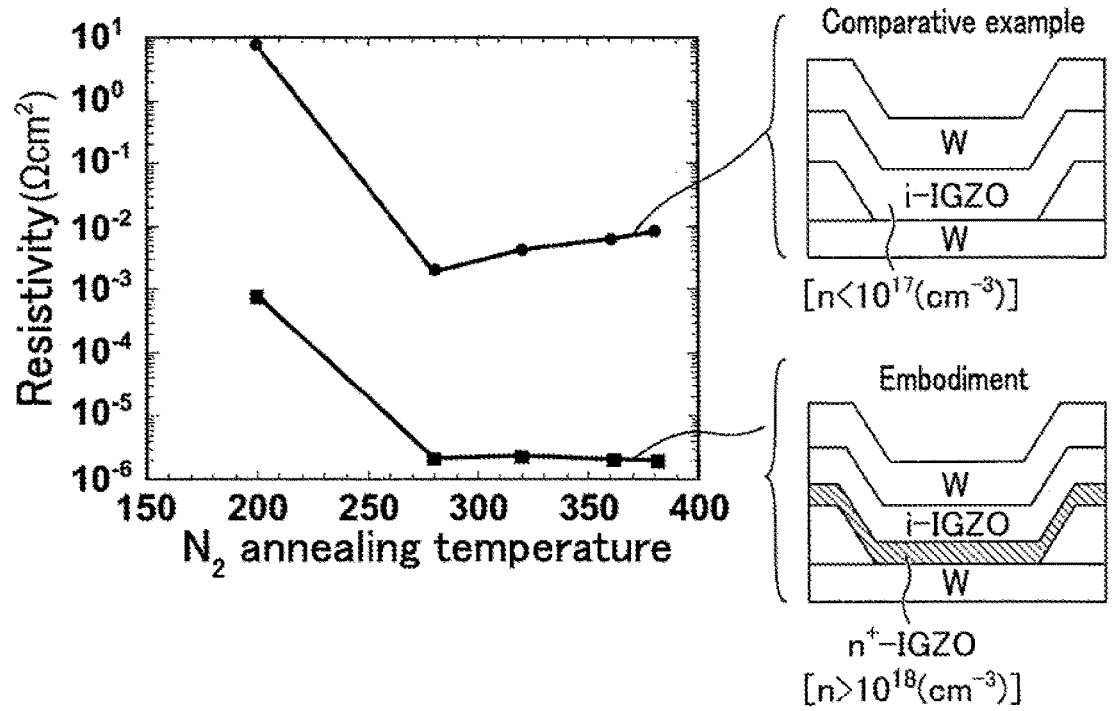
FIG. 12 is a graph showing an example of the result of measurement of resistivity of each of the contact structure in the embodiment and the contact structure of the comparative example.

In the structure according to the comparative example shown in FIG. 12, tungsten (W) is provided as the bottom electrode and the top electrode, and i-IGZO is provided between the bottom electrode and the top electrode as the oxide semiconductor. In the structure according to the embodiment, $n^+$-IGZO is provided between the bottom electrode and i-IGZO, unlike in the structure according to the comparative example. $n^+$-IGZO is designed to have the same carrier density as oxide semiconductor 12 (for example, $n<10^{17}$ ($cm^{-3}$)) and i-IGZO is designed to have the same carrier density as oxide semiconductor 17 (for example, $n>10^{18}$ ($cm^{-3}$)). Namely, the carrier density of $n^{-+}$-IGZO is higher than that of i-IGZO. The horizontal axis of the graph shown in FIG. 12 corresponds to the $N_2$ annealing temperature (° C.), and the vertical axis corresponds to the resistivity ($\Omega \cdot \mu m$) between the top electrode and the bottom electrode in each structure.

As shown in FIG. 12, the resistivity in the structure according to the embodiment is lower than that in the structure according to the comparative example at any $N_2$ annealing temperature. Namely, FIG. 12 shows that $n^+$-IGZO inserted in the structure according to the embodiment contributes to a decrease in resistivity between i-IGZO and the bottom electrode.

From this finding, formation of metal oxide at the interface between the bottom electrode and oxide semiconductor is considered to be inhibited because the carrier density of $n^+$-IGZO is low, i.e., $n^+$-IGZO contains less oxygen than i-IGZO.

As described above, in the transistor 10 according to the first embodiment, the contact resistance between conductor 11 corresponding to the bottom electrode BE and oxide semiconductor 17 in which the channel is formed can be made smaller by oxide semiconductor 12 inserted between conductor 11 and oxide semiconductor 17.

Accordingly, the transistor 10 according to the first embodiment can inhibit an increase in the contact resistance of the electrode in contact with the channel at its bottom, and can decrease the parasitic resistance of the channel. Therefore, the transistor 10 of the first embodiment can improve the drive ability of the transistor 10 even in the case where an oxide semiconductor is used as the channel.

Figure 13:
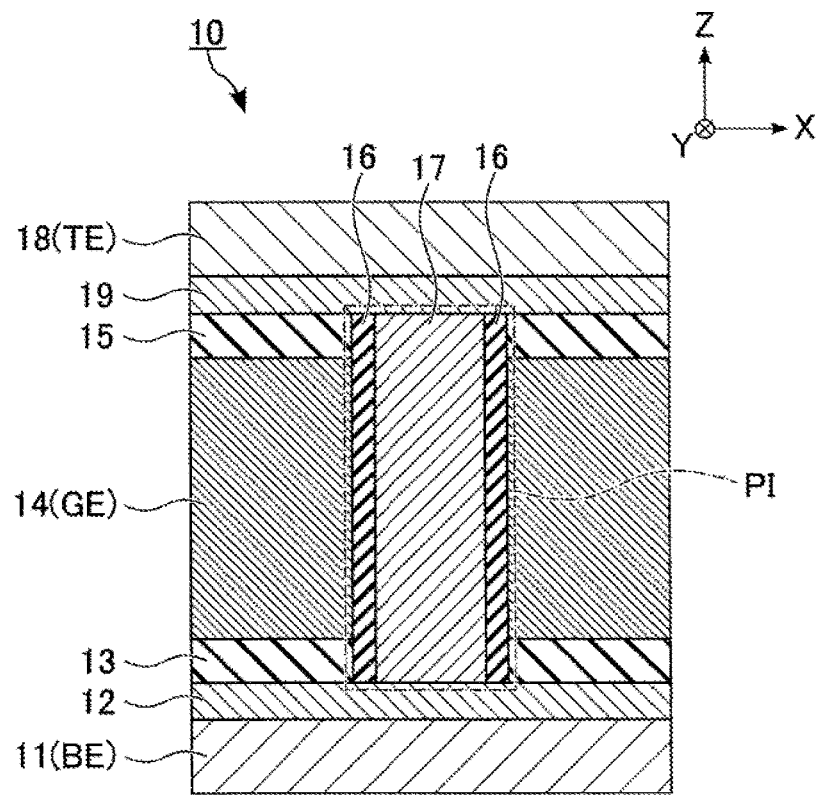
FIG. 13 is a cross-sectional view showing an example of the cross-section structure of the transistor according to a modification of the first embodiment.

It should be noted that the same oxide semiconductor as oxide semiconductor 12 may be provided between oxide semiconductor 17 in which the channel is formed and conductor 18 corresponding to the top electrode TE. FIG. 13 shows an example of the cross-section structure of the transistor 10 according to a modification of the first embodiment.

As shown in FIG. 13, the transistor 10 according to the modification of the first embodiment has a structure in which oxide semiconductor 19 is added to the transistor 10 according to the first embodiment described with reference to FIG. 2. Oxide semiconductor 19 has a higher carrier density than oxide semiconductor 17, and is formed between oxide semiconductor 17 and conductor 18.

In this case, formation of high-resistance metal oxide between oxide semiconductor 17 and conductor 18 can be inhibited in the transistor 10. Namely, oxide semiconductor 19 can lower the contact resistance between oxide semiconductor 17 and conductor 18. Therefore, the transistor 10 according to the modification of the first embodiment can lower the parasitic resistance of the channel more than the transistor 10 according to the first embodiment. The carrier density of oxide semiconductor 19 may be approximately equal to that of oxide semiconductor 12.

[2] Second Embodiment

The transistor 10 according to a second embodiment is the obtained by changing the timing of formation of oxide semiconductor 12 in the process for manufacturing the transistor 10 according to the first embodiment. Hereinafter, the transistor 10 according to the second embodiment will be described regarding the points different from the first embodiment.

[2-1] Configuration of Transistor 10

Figure 14:
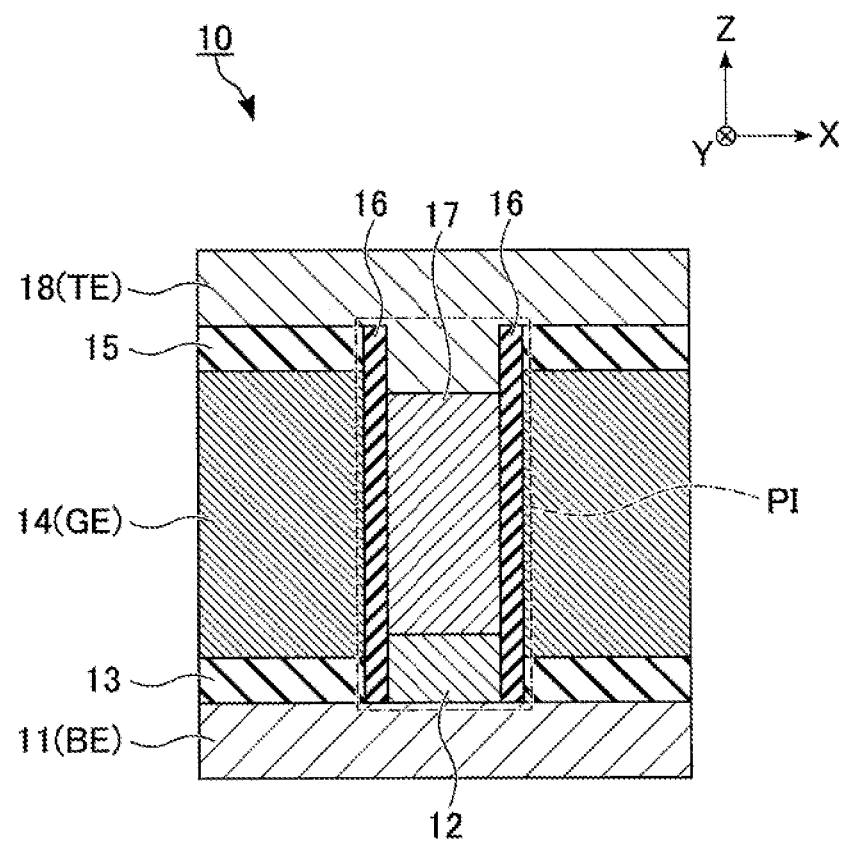
FIG. 14 is a cross-sectional view showing an example of the cross-section structure of the transistor according to a second embodiment.

FIG. 14 shows an example of the cross-section structure of the transistor 10 according to the second embodiment. Like the transistor according to the first embodiment, the transistor 10 according to the second embodiment includes conductors 11, 14, and 18, insulators 13 and 15, and a pillar portion PI, as shown in FIG. 14.

Insulator 13 is provided on conductor 11. Conductor 14 is provided on insulator 13. Insulator 15 is provided on conductor 14. Conductor 18 is provided on insulator 15. The pillar portion PI is provided between oxide semiconductor 12 and conductor 18.

The pillar portion PI includes the gate insulating film 16, oxide semiconductors 12 and 17, and part of conductor 18. The gate insulating film 16 is cylindrically provided in the pillar portion PI in contact with conductor 14.

Oxide semiconductor 12 is provided on conductor 11 in the region surrounded by the gate insulating film 16. Specifically, oxide semiconductor 12 is provided from the bottom of the layer in which conductor 13 is formed to a lower part of the layer in which conductor 14 is formed. The bottom of oxide semiconductor 12 is in contact with conductor 11, and the top of oxide semiconductor 12 is included in the lower part of the layer in which conductor 14 is formed.

Oxide semiconductor 17 is provided on oxide semiconductor 12 in the region surrounded by the gate insulating film 16. Specifically, oxide semiconductor 17 is provided from the top of oxide semiconductor 12 to an upper part of the layer in which conductor 14 is formed. The bottom of oxide semiconductor 17 is in contact with oxide semiconductor 12.

Part of conductor 18 is provided on oxide semiconductor 17 in the region surrounded by the gate insulating film 16. Conductor 18 provided on insulator 15 is, for example, integrally formed with conductor 18 provided on the pillar portion PI. The bottom of conductor 18 included in the pillar portion PI is in contact with the top of oxide semiconductor 17, and is included in the upper part of the layer in which conductor 14 is formed.

As described above, in the transistor 10 according to the second embodiment, oxide semiconductor 17 in which the channel is formed is included in the layer in which conductor 14 is formed. In other words, oxide semiconductor 17 is not included in the layer below conductor 14 in which insulator 13 is formed or the layer above conductor 14 in which insulator 15 is formed.

The other part of the structure of the transistor 10 according to the second embodiment is the same as that of the transistor 10 according to the first embodiment, and descriptions thereof will be omitted.

[2-2] Method for Manufacturing Transistor 10

Figure 15:
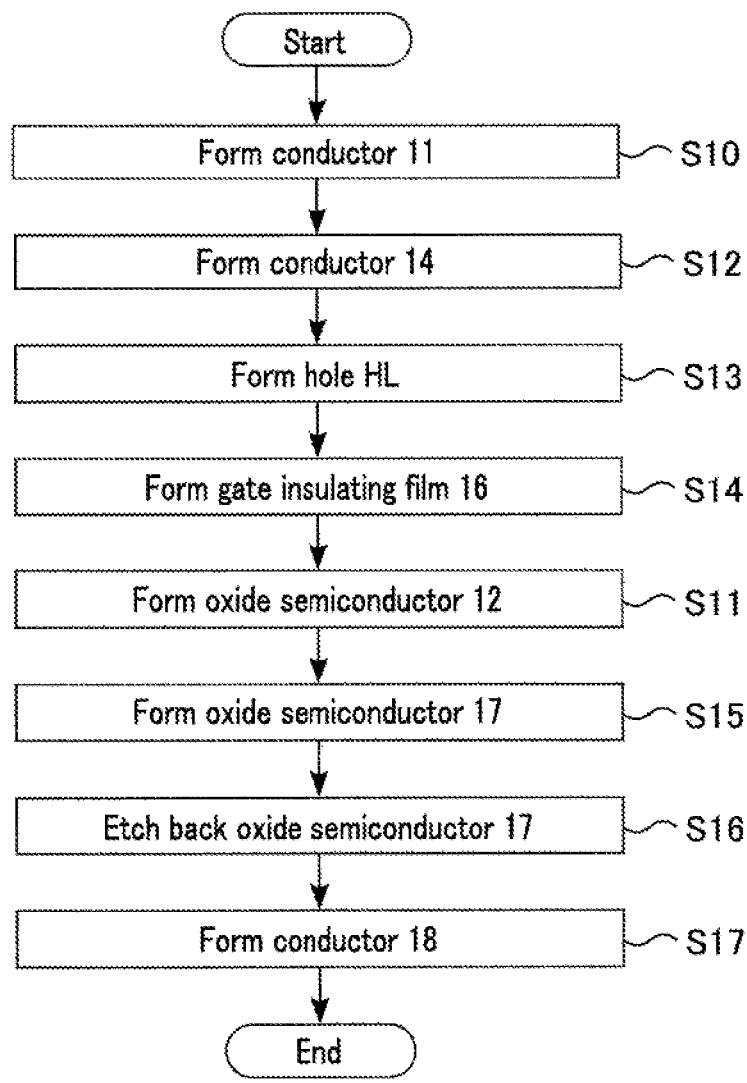
FIG. 15 is a flowchart showing an example of the method of manufacturing the transistor according to the second embodiment.

FIG. 15 is a flowchart showing an example of the process for manufacturing the transistor 10 according to the second embodiment, and FIGS. 16-20 each show an example of the cross-section structure in respective manufacturing processes of the transistor 10. Hereinafter, an example of the method of manufacturing the transistor 10 according to the second embodiment from formation of the bottom electrode BE to formation of the top electrode TE will be described with reference to FIG. 15, and one of FIGS. 16-20.

As shown in FIG. 15, the process for manufacturing the transistor 10 of the second embodiment differs from the process for manufacturing the transistor 10 of the first embodiment described with reference to FIG. 3 in terms of the timing in which the process of step S11 is performed.

First, the process of step S10 and the process of step S12 are successively performed. Specifically, conductor 11 corresponding to the bottom electrode BE, insulator 13, conductor 14 corresponding to the gate electrode GE, and insulator 15 are formed above a substrate (not shown) in the ascending order of the layer, as shown in FIG. 16.

Next, the process of step S13 and the process of step S14 are successively performed. Specifically, a hole HL corresponding to the pillar portion PI is formed, and the gate insulating film 16 is formed on the inner wall of the hole HL, as shown in FIG. 17.

Figure 18:
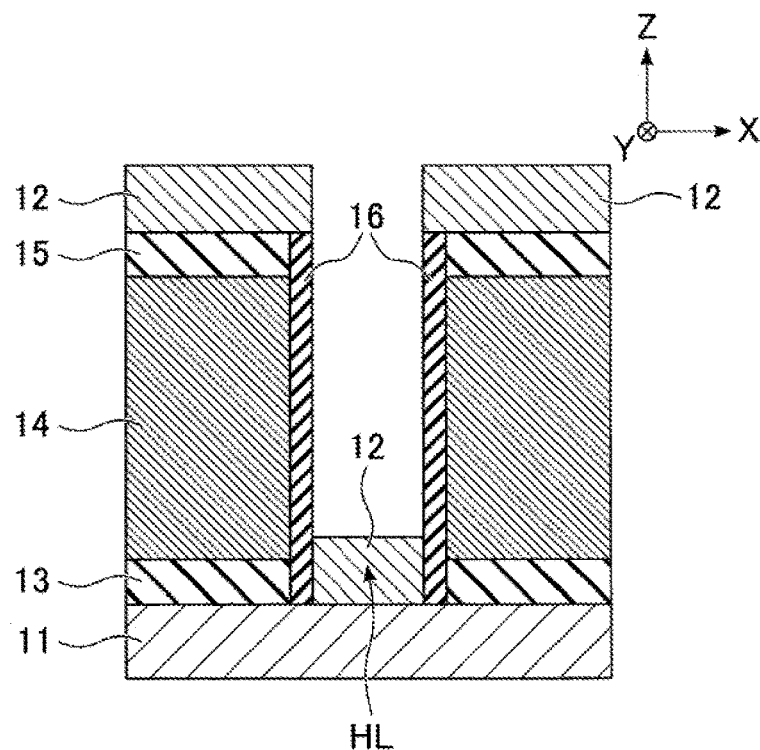

Next, the process of step S11 is performed. Specifically, as shown in FIG. 18, oxide semiconductor 12 is formed on the upper surfaces of insulator 15, the gate insulating film 16, and the bottom of the hole HL. As in the first embodiment, oxide semiconductor 12 is formed by sputtering in a chamber with an atmosphere of inactive gas, such as argon (Ar) only, and the target of the sputtering is, for example, IGZO (InGaZnO).

Figure 19:
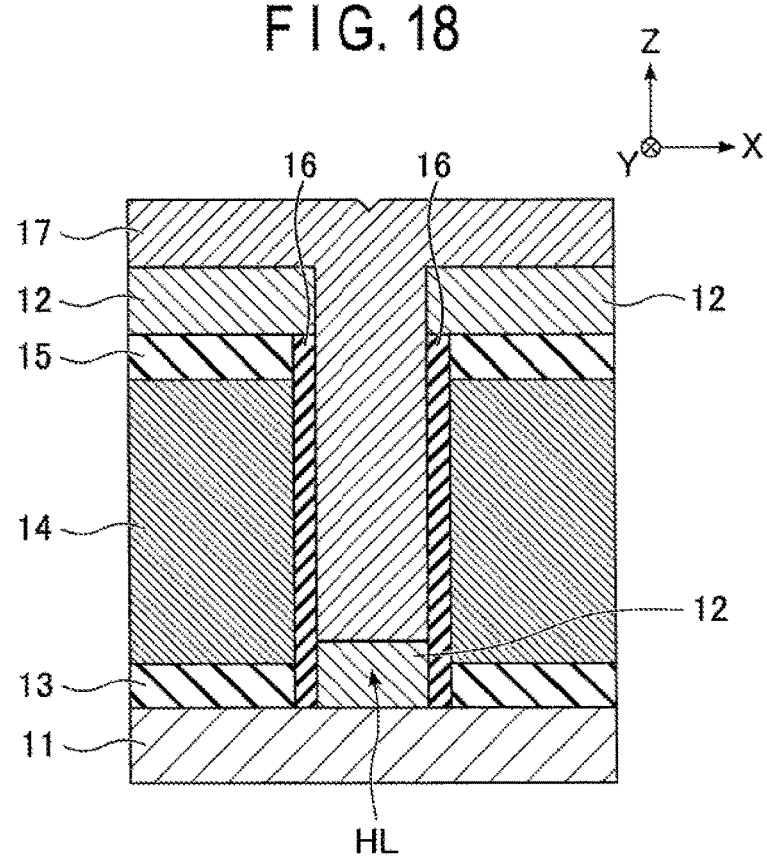

Next, the process of step S15 is performed. Specifically, oxide semiconductor 17 is filled in the entire hole HL by, for example, ALD to be brought into contact with oxide semiconductor 12 formed in the bottom of the hole HL, as shown in FIG. 19. In this process, as oxide semiconductor 17 is formed in the hole HL, oxide semiconductor 17 is also formed on oxide semiconductor 12 formed on insulator 15.

Figure 20:
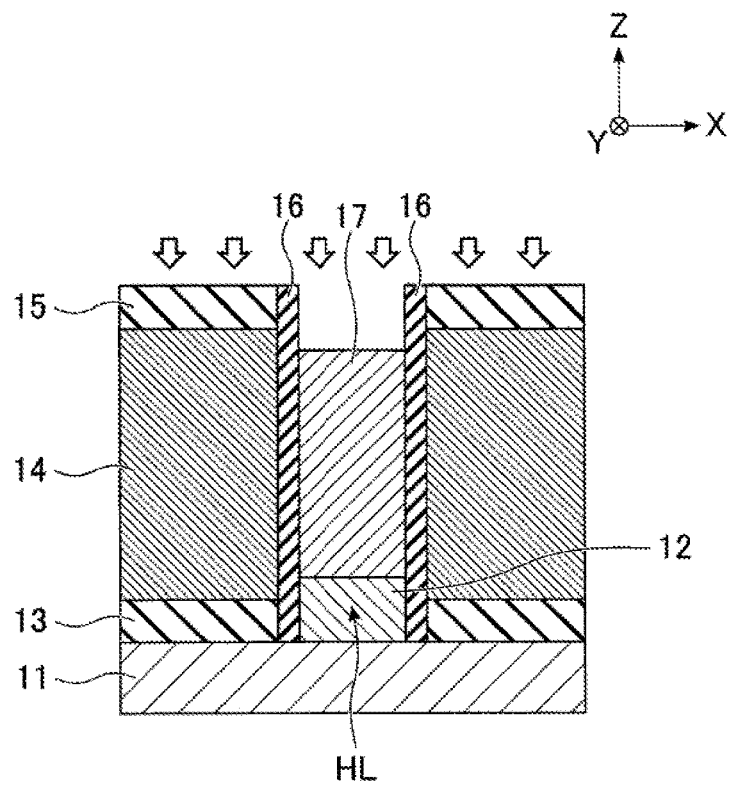

Next, the process of step S16 is performed. Specifically, oxide semiconductor 17 is etched back, as shown in FIG. 20.

In the etching back process, for example, oxide semiconductors 12 and 17, formed above the layer in which insulator 15 is formed, and oxide semiconductor 17, formed in the hole HL from the top of the layer in which insulator 15 is formed to the upper part of the layer in which conductor 14 is formed, are removed.

Then, the process of step S17 is performed, and conductor 18 corresponding to the top electrode TE is formed. Accordingly, the structure of the transistor 10 according to the second embodiment described with reference to FIG. 14 is formed.

[2-3] Advantage of Second Embodiment

Like the transistor 10 according to the first embodiment, the transistor 10 according to the second embodiment as described above can inhibit an increase in the contact resistance.

In the transistor 10 according to the second embodiment, part of oxide semiconductor 12 formed into a pillar shape overlaps conductor 14 corresponding to the gate electrode GE. In addition, conductor 18 corresponding to the top electrode TE includes the pillar portion, and part of the pillar portion overlaps conductor 14.

Consequently, the transistor 10 according to the second embodiment can also lower the offset resistance caused by a portion of the channel separated from the gate electrode, different from the transistor 10 according to the first embodiment. Therefore, the transistor 10 of the second embodiment can lower the parasitic resistance of the channel and can improve the drive ability of the transistor 10 in comparison with the transistor 10 of the first embodiment.

Figure 21:
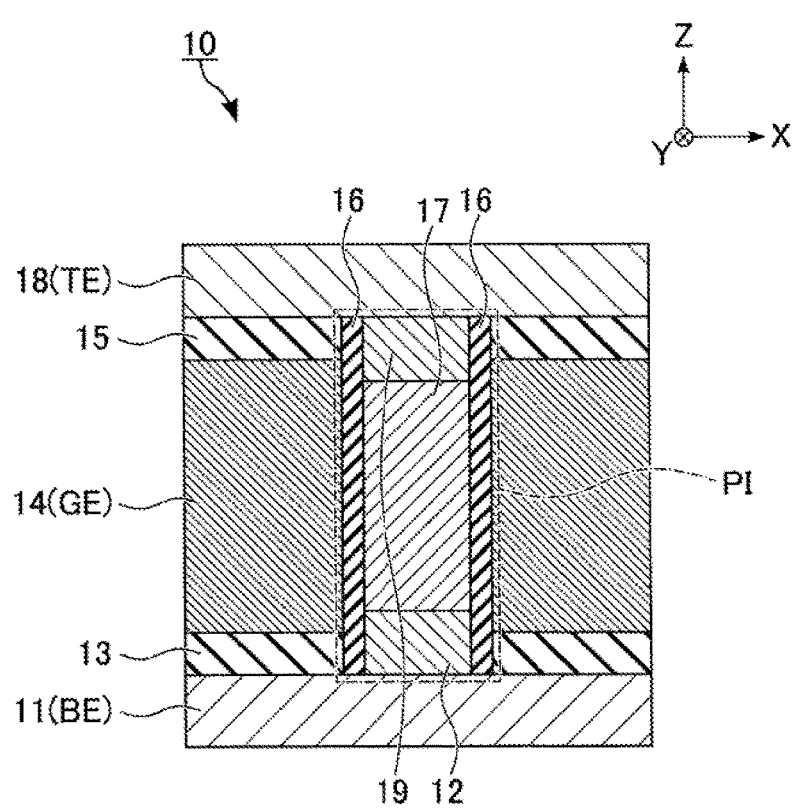
FIG. 21 is a cross-sectional view showing an example of the cross-section structure of the transistor according to a modification of the second embodiment.

The same oxide semiconductor as oxide semiconductor 12 may be provided between oxide semiconductor 17 in which the channel is formed and conductor 18 corresponding to the top electrode TE. FIG. 21 shows an example of the cross-section structure of the transistor 10 according to a modification of the second embodiment.

As shown in FIG. 21, the transistor 10 according to the modification of the second embodiment has a structure in which oxide semiconductor 19 is added to the transistor 10 according to the second embodiment described with reference to FIG. 14.

Oxide semiconductor 19 has a higher carrier density than oxide semiconductor 17, and is formed between oxide semiconductor 17 and conductor 18 in the region surrounded by the gate insulating film 16. In the transistor 10 according to the modification of the second embodiment, conductor 18 may be or may not be included in the pillar portion PT.

In this case, formation of high-resistance metal oxide between oxide semiconductor 17 and conductor 18 can be inhibited in the transistor 10. Namely, oxide semiconductor 19 can lower the contact resistance between oxide semiconductor 17 and conductor 18. Therefore, the transistor 10 according to the modification of the second embodiment can lower the parasitic resistance of the channel more than the transistor 10 according to the second embodiment. The carrier density of oxide semiconductor 19 may be approximately equal to that of oxide semiconductor 12.

[3] Third Embodiment

A semiconductor memory device 20 according to a third embodiment is an example of the memory device configured using the transistor 10 according to the first embodiment or the second embodiment. Hereinafter, the semiconductor memory device 20 according to the third embodiment will be described.

[3-1] Configuration of Semiconductor Memory Device 20

The transistor 10 according to the first embodiment or the second embodiment is used for a memory cell of, for example, a dynamic random access memory (DRAM). FIG. 22 shows an example of the circuit configuration of the semiconductor memory device 20 according to the third embodiment. The semiconductor memory device 20 according to the third embodiment includes, for example, a cell transistor TR, a cell capacitor CA, a word line WL, and a bit line BL, as shown in FIG. 22.

One end of the cell transistor TR is coupled to one end of the cell capacitor CA. The other end of the cell transistor TR is coupled to the bit line BL. The gate of the cell transistor TR is coupled to the word line WL. The other end of the cell capacitor CA is grounded.

The set of the cell transistor TR and capacitor CA as described above corresponds to a single memory cell MC. The memory cell MC can store data based on the charge held by the cell capacitor CA.

The semiconductor memory device 20 can read data stored in the memory cell MC out to the bit line BL by controlling the word line WL, and write data transferred to the bit line BL into the memory cell MC.

Figure 23:
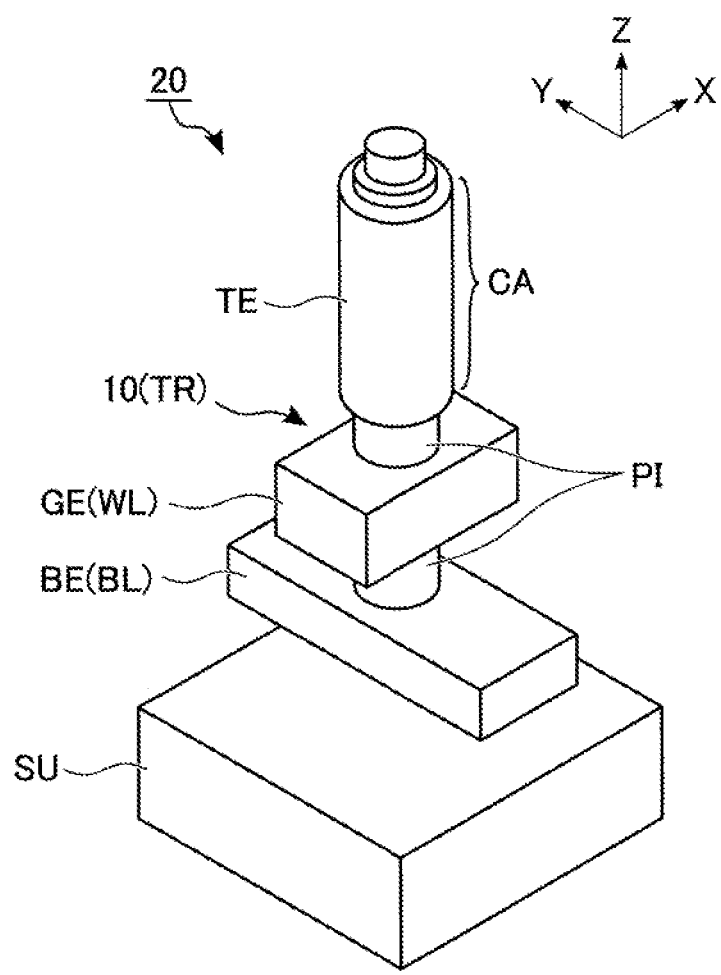
FIG. 23 is a perspective view showing a structure example of the semiconductor memory device according to the third embodiment.

FIG. 23 is a perspective view showing a structure example of the semiconductor memory device 20 according to the third embodiment. The semiconductor memory device 20 includes a transistor 10 and a cell capacitor CA as shown in FIG. 23. In the third embodiment, the transistor 10 is provided, for example, between the substrate SU and the cell capacitor CA.

The transistor 10 functions as the cell transistor TR included in the memory cell MC. Specifically, for example, the bottom electrode BE of the transistor 10 functions as the bit line BL, the gate electrode GE of the transistor 10 functions as the word line WL, and the top electrode TE of the transistor 10 functions as the electrode of the cell capacitor CA.

FIG. 24 shows an example of the cross-section structure of the semiconductor memory device 20 according to the third embodiment in the case where the transistor 10 according to the first embodiment is adopted as the cell transistor TR. The structure of the transistor 10 is the same as that of the transistor 10 according to the first embodiment described with reference to FIG. 2. The cell capacitor CA includes conductors 18 and 20 and an insulating film 22 as shown in FIG. 24.

Conductor 21 is formed into, for example, a pillar shape extending in the Z-direction. The insulating film 22 covers the side and bottom surfaces of conductor 21. Conductor 18 which functions as the top electrode TE of the transistor 10 covers the side and bottom surfaces of the insulating film 22. Namely, conductor 21 is insulated from conductor 18 by the insulating film 22.

With such a structure of the semiconductor memory device 20, the set of the transistor 10 according to the first embodiment and the call capacitor CA functions as a memory cell MC of a DRAM. In the semiconductor memory device 20 shown in FIG. 24, oxide semiconductor 12 may be provide between oxide semiconductor 17 and conductor 18 as in the structure of the transistor 10 according to the modification of the first embodiment shown in FIG. 13.

FIG. 25 shows an example of the cross-section structure of the semiconductor memory device 20 according to the third embodiment in the case where the transistor 10 according to the second embodiment is adopted as the cell transistor TR. As shown in FIG. 25, the semiconductor memory device 20 in the case where the transistor 10 according to the second embodiment is adopted has the structure of the semiconductor memory device 20 described with reference to FIG. 24 in which the structure of the transistor 10 is replaced with that of the transistor 10 according to the second embodiment. Namely, in the structure of the semiconductor memory device 20 shown in FIG. 25, conductor 18 is formed to enter the pillar portion PI.

Even in such a structure of the semiconductor memory device 20, the set of the transistor 10 according to the second embodiment and the call capacitor CA functions as a memory cell MC of a DRAM. In the semiconductor memory device 20 shown in FIG. 25, oxide semiconductor 19 may be provided instead of conductor 18 provided inside the pillar portion PI as in the structure of the transistor 10 according to the modification of the second embodiment shown in FIG. 21.

[3-2] Advantage of Third Embodiment

As described above, the semiconductor memory device 20 according to the third embodiment can use the transistor 10 according to the first embodiment and the transistor 10 according to the second embodiment as a cell transistor used in a memory cell MC of a DRAM.

As described in the first embodiment and the second embodiment, the transistor 10 has excellent off-leak characteristics, and has a structure that inhibits a decrease in the drive ability. Namely, in the memory cell MC using the transistor 10 as the cell transistor TR, the charging and discharging operations on the cell capacitor CA via the transistor 10 are quick.

Accordingly, the semiconductor memory device 20 according to the third embodiment can inhibit an increase in the time for writing in and reading from the cell capacitor CA due to the drive ability of the cell transistor TR, and thus can speed up the writing and reading operations.

[4] Fourth Embodiment

The semiconductor memory device 20 according to a fourth embodiment has a circuit configuration similar to that of the semiconductor memory device 20 according to the third embodiment; however, the coupling direction of the transistor 10 is different. Hereinafter, the semiconductor memory device 20 according to the fourth embodiment will be described regarding the points different from the semiconductor memory device 20 according to the third embodiment.

[4-1] Structure of Semiconductor Memory Device 20

Figure 26:
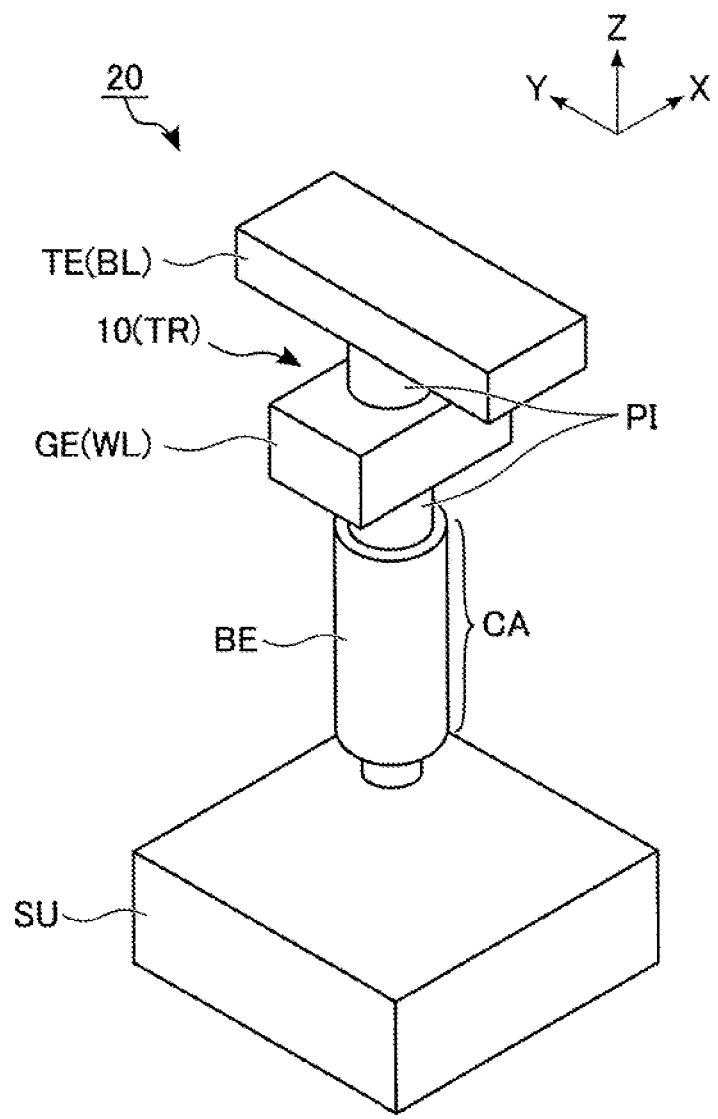
FIG. 26 is a perspective view showing a structure example of the semiconductor memory device according to a fourth embodiment.

FIG. 25 is a perspective view showing a structure example of the semiconductor memory device 20 according to the fourth embodiment. The semiconductor memory device 20 according to the fourth embodiment includes a transistor 10 and a cell capacitor CA, as shown in FIG. 26. In the fourth embodiment, the cell capacitor CA is provided, for example, between the substrate SU and the transistor 10.

The transistor 10 functions as the cell transistor TR included in the memory cell MC. The top electrode TE of the transistor 10 functions as the bit line BL, the gate electrode GE of the transistor 10 functions as the word line WL, and the bottom electrode BE of the transistor 10 functions as the electrode of the cell capacitor CA.

Figure 27:
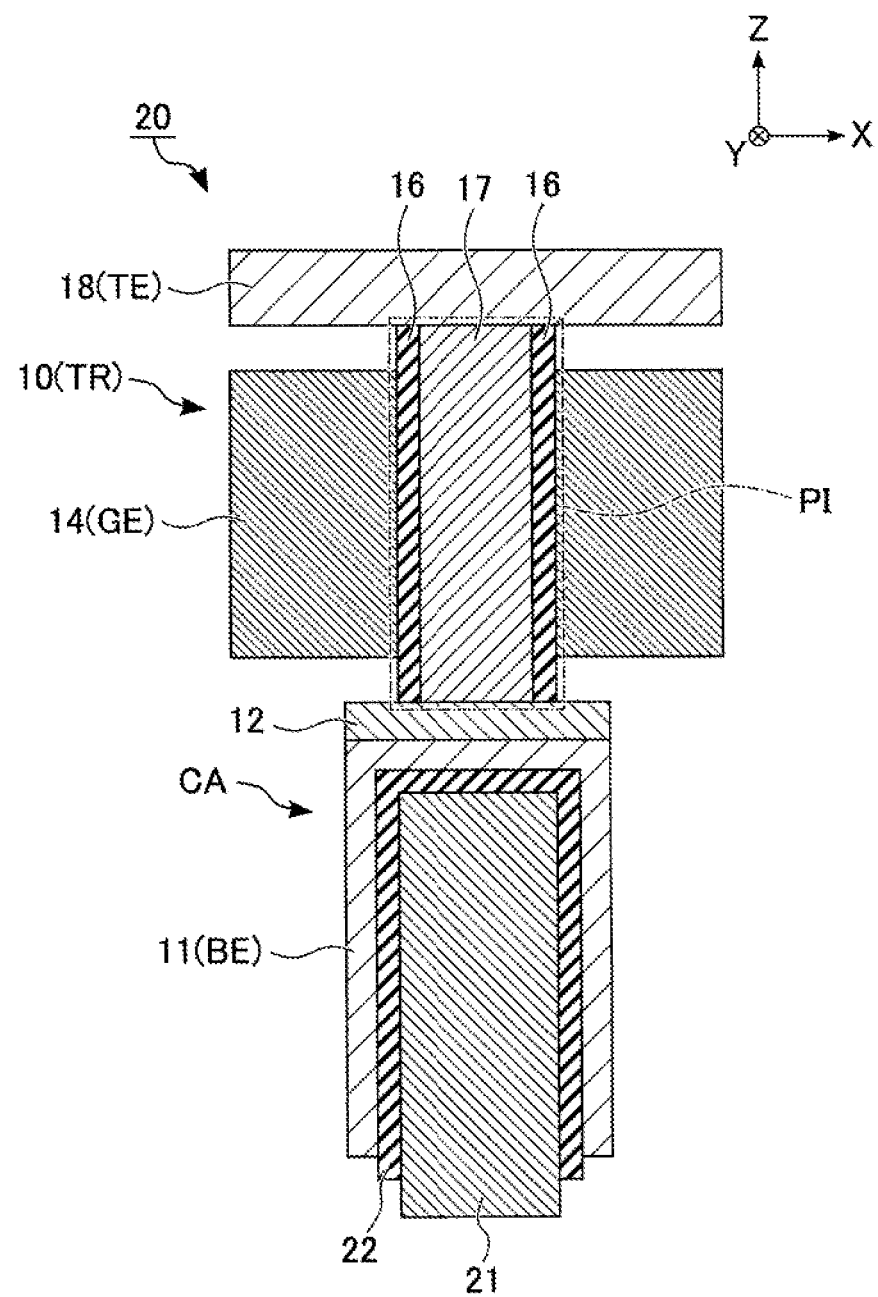

FIG. 27 shows an example of the cross-section structure of the semiconductor memory device 20 according to the fourth embodiment in the case where the transistor 10 according to the first embodiment is adopted as the cell transistor TR. The structure of the transistor 10 is the same as that of the transistor 10 according to the first embodiment described with reference to FIG. 2. The cell capacitor CA includes conductors 18 and 20, and an insulating film 22, as shown in FIG. 27.

Conductor 21 is formed into, for example, a pillar shape extending in the Z-direction. Insulating film 22 covers the side and upper surfaces of conductor 21. Conductor 11, which functions as the bottom electrode BE of the transistor 10 covers the side and upper surfaces of the insulating film 22. Namely, conductor 21 is insulated from conductor 11 by the insulating film 22.

With such a structure of the semiconductor memory device 20, the set of the transistor 10 according to the first embodiment and the cell capacitor CA functions as a memory cell. MC of a DRAM. In the semiconductor memory device 20 shown in FIG. 27, oxide semiconductor 12 may be provided between oxide semiconductor 17 and conductor 18 as in the structure of the transistor 10 according to the modification of the first embodiment shown in FIG. 13.

FIG. 28 shows an example of the cross-section structure of the semiconductor memory device 20 according to the fourth embodiment in the case where the transistor 10 according to the second embodiment is adopted as the cell transistor TR. As shown in FIG. 28, the semiconductor memory device 20 in the case where the transistor 10 according to the second embodiment is adopted has the structure of the semiconductor memory device 20 described with reference to FIG. 27 in which the structure of the transistor 10 is replaced with that of the transistor 10 according to the second embodiment. Namely, in the structure of the semiconductor memory device 20 shown in FIG. 28, conductor 18 is formed to enter the pillar portion PI.

Even in such a structure of the semiconductor memory device 20, the set of the transistor 10 according to the second embodiment and the call capacitor CA functions as a memory cell MC of a DRAM. In the semiconductor memory device 20 shown in FIG. 28, oxide semiconductor 19 may be provided instead of conductor 18 provided inside the pillar portion PI as in the structure of the transistor 10 according to the modification of the second embodiment shown in FIG. 21.

[4-2] Advantage of Fourth Embodiment

As described above, the semiconductor memory device 20 according to the fourth embodiment can use the transistor 10 according to the first embodiment and the transistor 10 according to the second embodiment as a cell transistor used in a memory cell MC of a DRAM, with a structure different from that of the semiconductor memory device 20 according to the third embodiment. Accordingly, the semiconductor memory device 20 according to the fourth embodiment can gain the same advantage as the semiconductor memory device 20 according to the third embodiment.

[5] Modifications, Etc.

According to one embodiment, a transistor includes first to third conductors, first and second oxide semiconductors, and a gate insulating film. The first and second conductors are stacked via an insulator above a substrate. The first oxide semiconductor is formed on the first conductor. The second oxide semiconductor is formed on the first oxide semiconductor. The second oxide semiconductor have a pillar shape through the second conductor along a first direction crossing a surface of the substrate. The second oxide semiconductor is different from the first oxide semiconductor. The gate insulating film is formed between the second conductor and the second oxide semiconductor. The third conductor is formed on the second oxide semiconductor. Therefore, the transistor according to the embodiments can inhibit an increase in the contact resistance in the transistor.

In the above-described embodiments, the case where. IGZO (InGaZnO) is used as oxide semiconductor 12 is described as an example; however, oxide semiconductor 12 is not limited to this. Another oxide having a large electron affinity may be selected as oxide semiconductor 12.

Figure 29:
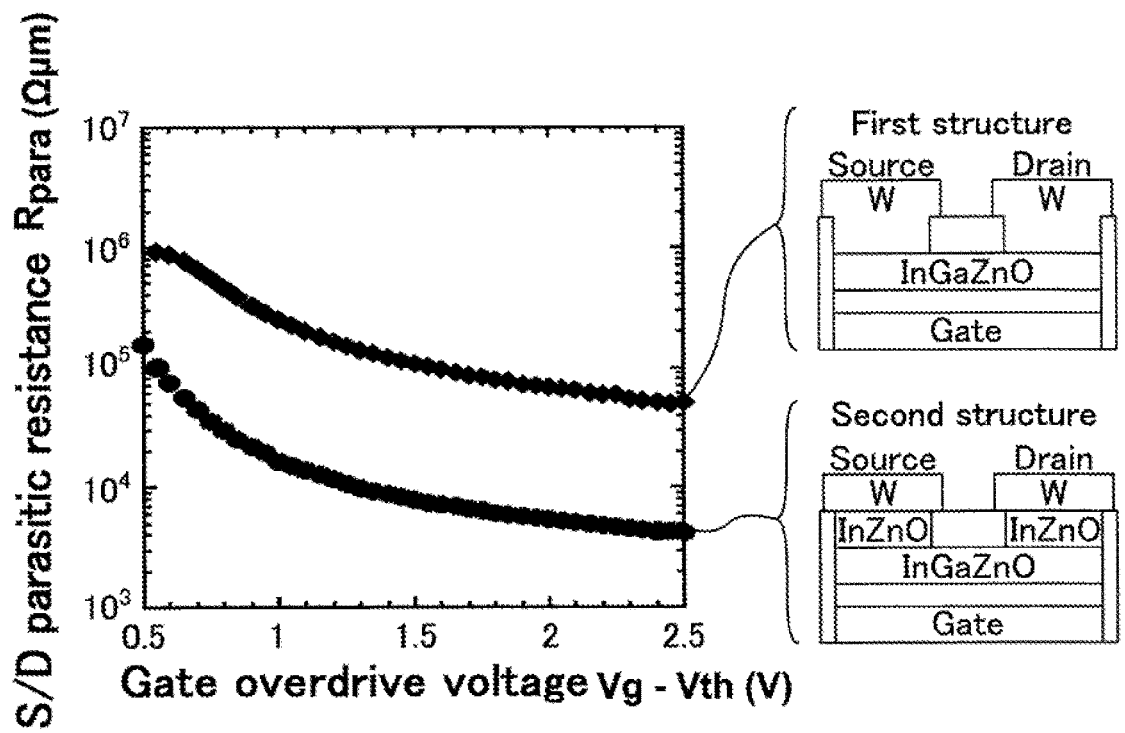
FIG. 29 is a graph showing an example of the dependency between the gate overdrive voltage and the source-drain parasitic resistance in each of two transistors having different contact structures.

FIG. 29 shows an example of dependency between the source-drain parasitic resistance and the gate overdrive voltage in each of two transistors having different contact structures. The gate overdrive voltage corresponds to a voltage obtained by subtracting the threshold voltage (Vth) of the transistor from the gate voltage (Vg).

In the first structure of the transistor shown in FIG. 29, a source electrode and drain electrode made of tungsten (W) are coupled to a layer of IGZO (InGaZnO) functioning as the channel from the upper surface of the channel. In the second structure of the transistor, an InZnO layer is inserted to the first structure of the transistor between the channel (InGaZnO) and the source electrode (W), and between the channel (InGaZnO) and the drain electrode (W). In other words, in the second structure of the transistor, InZnO is inserted to the contact interface between the channel and each of the source electrode and the drain electrode.

As shown in FIG. 29, the parasitic resistance ($R_{para}$) in the second structure of the transistor is a value approximately one digit smaller than the parasitic resistance ($R_{para}$) of the structure of the transistor whichever value the gate overdrive voltage (Vg-Vth) takes. Accordingly, FIG. 29 shows that the InZnO layer inserted between the channel and each electrode contributes to a decrease in the parasitic resistance in the transistor.

Figure 30:
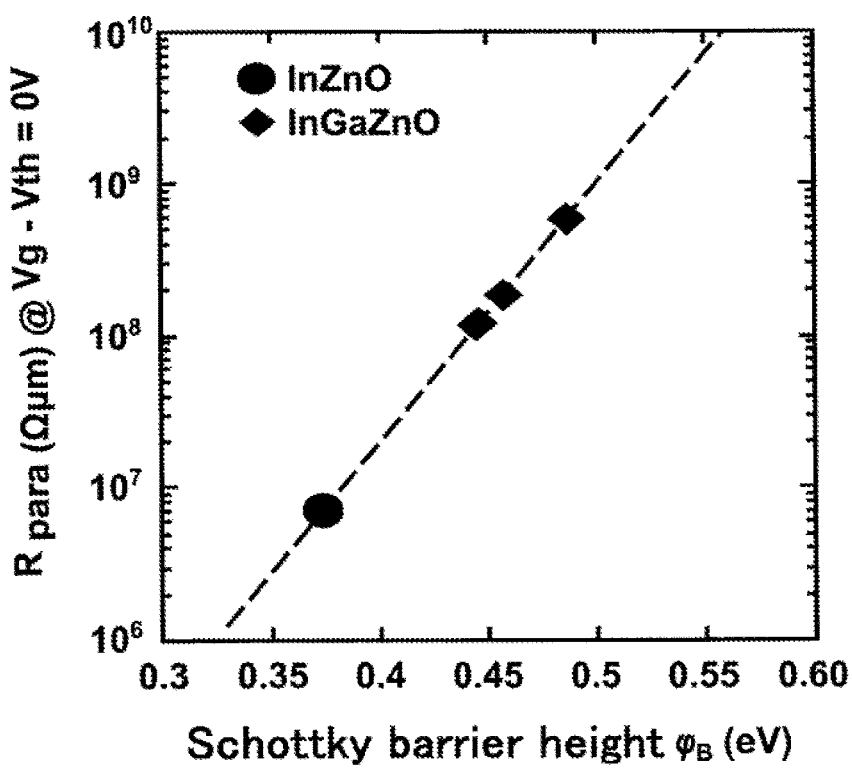
FIG. 30 is a graph showing an example of the relationship between the source-drain parasitic resistance and the Schottky barrier height of the contact interface in each of a plurality of transistors having different, contact structures.

FIG. 30 shows an example of the relationship between the source-drain parasitic resistance and the Schottky barrier height of the contact interface in each of a plurality of transistors in which the source electrode and drain electrode are tungsten, and the channel composition is varied. The measurement results shown in FIG. 30 correspond to results obtained under different conditions of the material of the layer corresponding to InZnO in the second structure of the transistor shown in FIG. 29.

As shown in FIG. 30, in the case where IGZO (InGaZnO) is inserted to the contact interface, as the Schottky barrier height ($\varphi_B$) at the contact interface decreases, the parasitic resistance ($R_{para}$) in the transistor decreases. In the case where InZnO is inserted to the contact interface, the Schottky barrier height ($\varphi_B$) at the contact interface is lower than the Schottky barrier height ($\varphi_B$) of the case where IGZO is inserted to the contact interface. In addition, the parasitic resistance ($R_{para}$) of the case where InZnO is inserted to the contact interface is smaller than the parasitic resistance ($R_{para}$) of the case where IGZO is inserted to the contact interface.

Accordingly, the transistor using the oxide material having the larger electron affinity as the channel is considered to have lower source-drain parasitic resistance because the Schottky barrier height with respect to the tungsten electrode is lower when the oxide material has a larger electron affinity.

Figure 31:
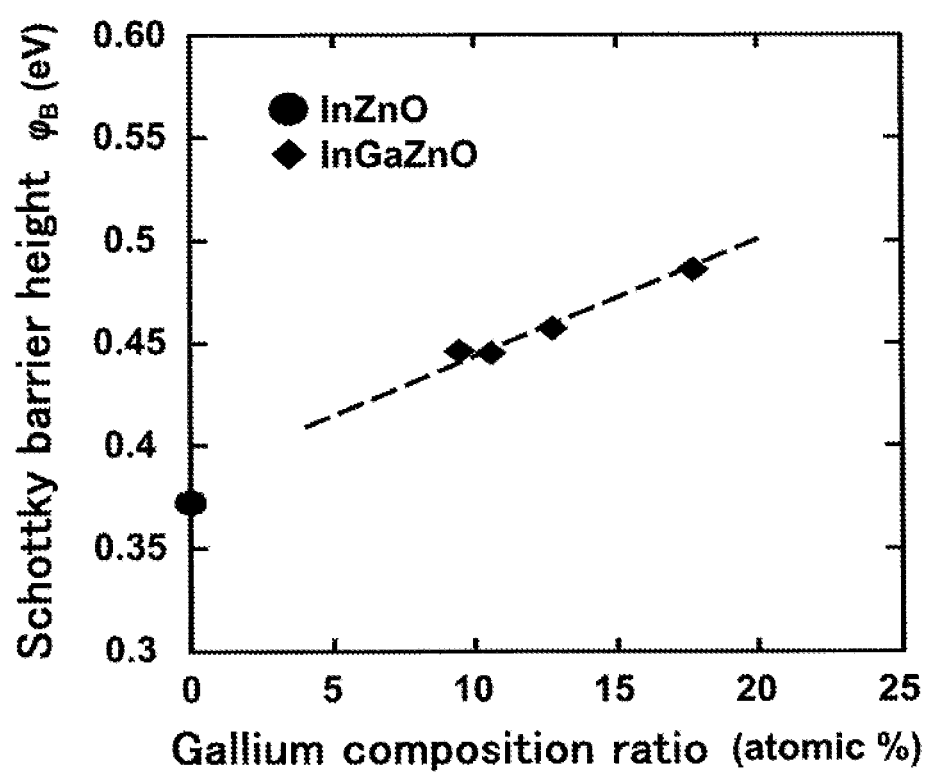
FIG. 31 is a graph showing an example of the relationship between the Schottky barrier height and the gallium composition ratio of the contact interface.

FIG. 31 shows an example of the relationship between the Schottky barrier height and the gallium composition ratio of the contact interface. As shown in FIG. 31, IGZO (InGaZnO) has a lower Schottky barrier height ($\varphi_B$) of the contact interface when the gallium composition ratio is smaller. InZnO, which is obtained by removing gallium from IGZO, has a lower Schottky barrier height ($\varphi_B$) of the contact interface than any IGZO. Namely, IGZO is considered to have a larger electron of as the gallium composition ratio decreases. In this specification, the "gallium composition ratio" refers to a composition ratio of gallium to the number of all the atoms contained in the target constituent element (Ga atomic %).

As described above, a material that makes the Schottky barrier height of the contact interface low, i.e., a large-electron affinity material, can be used as oxide semiconductor 12 of the transistor 10 in the above-described embodiments. In this case, the gallium composition ratio in oxide semiconductor 12 is smaller than that in oxide semiconductor 17. The transistor 10 using such a material for oxide semiconductor 12 can lower the source-drain parasitic resistance like the measurement result shown in FIG. 23.

Accordingly, the transistor 10 using a large-electron affinity material for oxide semiconductor 12 can have improved drive ability as in the above-described embodiments.

The process for manufacturing the transistor 10 described with reference to FIG. 3 in the first embodiment and the process for manufacturing the transistor 10 with reference to FIG. 14 in the second embodiment are mere examples. For example, another process may be inserted between processes of steps described in the first embodiment or the second embodiment. For example, in the above-described manufacturing processes, a process of photography and anisotropic etching may be inserted for processing each of conductors 11, 14, and 18 and oxide semiconductor 12 into a desired shape.

The case where oxide semiconductor 12 is formed by sputtering in the process of step S11 described with reference to FIG. 3 in the first embodiment is described as an example; however, the method of forming oxide semiconductor 12 is not limited to this. For example, in step S11 of the first embodiment, oxide semiconductor 12 may be formed by, for example, ALD, or other film formation methods.

In the third embodiment, the case where the top electrode TE of the cell transistor TR and the electrode of the cell capacitor CA are integrally formed is described as an example; however, the structure is not limited to this. The top electrode TE of the cell transistor TR may be electrically coupled to the electrode of the cell capacitor CA via a conductor different from conductor 18.

Similarly, in the fourth embodiment, the case where the bottom electrode BE of the cell transistor TR and the electrode of the cell capacitor CA are integrally formed is described as an example; however, the structure is not limited to this. The bottom electrode BE of the cell transistor TR may be electrically coupled to the electrode of the cell capacitor CA via a conductor different from conductor 11.

In the above-described embodiments, the case where the cell transistor TR is a vertical transistor is described as an example; however, the cell transistor TR is not limited to this. For example, oxide semiconductor 12 may be provided in a transistor in which the channel is formed in the substrate surface, between the channel and at least one of the source electrode and the drain electrode. Even in such a case, an increase in the contact resistance between the electrode and the channel can be inhibited as in the above-described embodiments.

In the third embodiment and the fourth embodiment, the case where the transistor 10 according to the first embodiment or the second embodiment is used as a cell transistor TR in a memory cell MC of a DRM is described as an example; however, the use is not limited thereto. The transistor 10 according to each of the first and second embodiments may be used in various semiconductor devices including the DRAM for various purposes.

Each of the structure between the bottom electrode BE and oxide semiconductor 17 and the structure between the top electrode TE and oxide semiconductor 17 described in the above embodiments may be a combination of the first embodiment and the second embodiment.

For example, the transistor 10 may have a structure in which the first embodiment is adopted for the structure between the bottom electrode BE and oxide semiconductor 17 and the second embodiment is adopted for the structure between the top electrode TE and oxide semiconductor 17. Similarly, the transistor 10 may have a structure in which the second embodiment is adopted for the structure between the bottom electrode BE and oxide semiconductor 17 and the first embodiment is adopted for the structure between the top electrode TE and oxide semiconductor 17. Even in such cases, the transistor 10 can gain the same advantage as that described in the above embodiments.

The "pillar" in this specification refers to the structure provided in the hole formed in the process for manufacturing the transistor 10. The drawings used for describing the above embodiments illustrate the case where the shape of the pillar portion PI is fixed regardless of the formed position; however, the pillar portion PI may have a tapered shape or a shape having an enlarged middle part.

The cross-section of the pillar portion PI parallel to the surface of the substrate SU may be oval or linear. Namely, the pillar portion PI is not necessarily columnar, and may be flat. Even in such cases, the transistor 10 can gain the same advantage as that described in the above embodiments.

In the above embodiments, the case where argon is used as the inactive gas filled in the chamber of the sputtering device when the film of oxide semiconductor 12 is formed is described as an example; however, another type of inactive gas may be used for the sputtering. The inactive gas includes, for example, helium, neon, krypton, xenon, and radon, and one of, for example, those types of inactive gas is used for the sputtering process for forming the film of oxide semiconductor 12.

In the above embodiments, the state where the chamber of the sputtering device includes inactive gas (such as argon) only includes the state where an unintended impurity is included in the chamber in addition to the inactive gas. Namely, in the above embodiments, it suffices that at least some inactive gas is filled in the chamber of the sputtering device when the film of oxide semiconductor 12 is formed, and that the oxygen density is lower than in the case where inactive gas is filled in the chamber.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transistor comprising:
a first conductor and second conductor stacked via an insulator above a substrate;
a first oxide semiconductor on the first conductor;
a second oxide semiconductor on the first oxide semiconductor, the second oxide semiconductor having a pillar shape through the second conductor along a first direction crossing a surface of the substrate, the second oxide semiconductor being different in at least one of a composition and a composition ratio from the first oxide semiconductor;
a gate insulating film between the second conductor and the second oxide semiconductor; and
a third conductor on the second oxide semiconductor, wherein
the second conductor functions as a gate electrode of the transistor, and
a carrier density of the first oxide semiconductor is higher than that of the second oxide semiconductor.

2. The transistor of claim 1, wherein
an electron affinity of the first oxide semiconductor is larger than that of the second oxide semiconductor.

3. The transistor of claim 1, wherein
the second oxide semiconductor contains at least one of indium, zinc, or tin.

4. The transistor of claim 1, wherein
the first oxide semiconductor has a pillar shape extending in the first direction,
a distance between a top of the first oxide semiconductor and the surface of the substrate in the first direction is larger than a distance between a bottom of the second conductor and the surface of the substrate in the first direction, and
the gate insulating film is provided between the first oxide semiconductor and the second conductor.

5. The transistor of claim 4, further comprising:
a third oxide semiconductor between the second oxide semiconductor and the third conductor.

6. The transistor of claim 5, wherein
the third oxide semiconductor has a pillar shape extending in the first direction,
a distance between a bottom of the third oxide semiconductor and the surface of the substrate in the first direction is smaller than a distance between a top of the second conductor and the surface of the substrate in the first direction, and
the gate insulating film is provided between the third oxide semiconductor and the second conductor.

7. The transistor of claim 1, wherein
the third conductor includes a pillar portion extending in the first direction and having a bottom in contact with the second oxide semiconductor,
a distance between a bottom of the pillar portion and the surface of the substrate in the first direction is smaller than a distance between a top of the second conductor and the surface of the substrate in the first direction, and
the gate insulating film is provided between the pillar portion and the second conductor.

8. The transistor of claim 1, wherein
the first oxide semiconductor and the second oxide semiconductor each contain gallium, and a gallium composition ratio of the first oxide semiconductor is smaller than a gallium composition ratio of the second oxide semiconductor.

9. A semiconductor memory device comprising:
the transistor of claim 1; and
a capacitor formed into a pillar shape and coupled to the first conductor or third conductor included in the transistor.

10. A transistor comprising:
a first conductor and a second conductor stacked via an insulator above a substrate;
a first oxide semiconductor on the first conductor;
a second oxide semiconductor on the first oxide semiconductor, the second oxide semiconductor having a pillar shape through the second conductor along a first direction crossing a surface of the substrate, the second oxide semiconductor being different in at least one of a composition and a composition ratio from the first oxide semiconductor;
a gate insulating film between the second conductor and the second oxide semiconductor; and
a third conductor on the second oxide semiconductor, wherein
the first oxide semiconductor has a pillar shape extending in the first direction,
a distance between a top of the first oxide semiconductor and the surface of the substrate in the first direction is larger than a distance between a bottom of the second conductor and the surface of the substrate in the first direction, and
the gate insulating film is provided between the first oxide semiconductor and the second conductor.

11. The transistor of claim 10, further comprising:
a third oxide semiconductor between the second oxide semiconductor and the third conductor.

12. The transistor of claim 11, wherein
the third oxide semiconductor has a pillar shape extending in the first direction,
a distance between a bottom of the third oxide semiconductor and the surface of the substrate in the first direction is smaller than a distance between a top of the second conductor and the surface of the substrate in the first direction, and
the gate insulating film is provided between the third oxide semiconductor and the second conductor.

13. A transistor comprising:
a first conductor and a second conductor stacked via an insulator above a substrate;
a first oxide semiconductor on the first conductor;
a second oxide semiconductor on the first oxide semiconductor, the second oxide semiconductor having a pillar shape through the second conductor along a first direction crossing a surface of the substrate, the second oxide semiconductor being different in at least one of a composition and a composition ratio from the first oxide semiconductor;
a gate insulating film between the second conductor and the second oxide semiconductor; and
a third conductor on the second oxide semiconductor, wherein
the third conductor includes a pillar portion extending in the first direction and having a bottom in contact with the second oxide semiconductor,
a distance between a bottom of the pillar portion and the surface of the substrate in the first direction is smaller than a distance between a top of the second conductor and the surface of the substrate in the first direction, and
the gate insulating film is provided between the pillar portion and the second conductor.

* * * * *